(12) United States Patent
Lee et al.

(10) Patent No.: US 12,087,645 B2
(45) Date of Patent: Sep. 10, 2024

(54) METHOD OF INSPECTING DISPLAY DEVICE AND METHOD OF MANUFACTURING DISPLAY DEVICE

(71) Applicant: Samsung Display Co., Ltd., Yongin-si (KR)

(72) Inventors: Seung Kyu Lee, Cheonan-si (KR); Ki Pyo Hong, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 464 days.

(21) Appl. No.: 17/445,378

(22) Filed: Aug. 18, 2021

(65) Prior Publication Data
US 2022/0148926 A1    May 12, 2022

(30) Foreign Application Priority Data
Nov. 11, 2020   (KR) .................. 10-2020-0150123

(51) Int. Cl.
| | |
|---|---|
| *H01L 21/66* | (2006.01) |
| *G01R 31/26* | (2020.01) |
| *G01R 31/54* | (2020.01) |
| *H01L 25/16* | (2023.01) |

(52) U.S. Cl.
CPC .......... *H01L 22/14* (2013.01); *G01R 31/2635* (2013.01); *G01R 31/54* (2020.01); *H01L 25/167* (2013.01)

(58) Field of Classification Search
CPC ....... H01L 21/14; H01L 25/167; G01R 31/54; G01R 31/2635
See application file for complete search history.

(56) References Cited

U.S. PATENT DOCUMENTS

| | | | |
|---|---|---|---|
| 6,545,500 B1 * | 4/2003 | Field ..................... | G09G 3/006 324/762.05 |
| 10,607,968 B2 | 3/2020 | Woo et al. | |
| 2011/0068699 A1 * | 3/2011 | Knapp .................. | H04L 12/43 315/158 |
| 2011/0133769 A1 | 6/2011 | Chen et al. | |
| 2020/0035941 A1 * | 1/2020 | Yoo ....................... | H10K 50/17 |

FOREIGN PATENT DOCUMENTS

| | | | |
|---|---|---|---|
| JP | 2939026 B2 | | 8/1999 |
| JP | 2011099745 A | * | 5/2011 |
| JP | 4864317 B2 | | 2/2012 |
| JP | 5056024 B2 | | 10/2012 |

* cited by examiner

*Primary Examiner* — Shaun M Campbell
(74) *Attorney, Agent, or Firm* — Lewis Roca Rothgerber Christie LLP

(57) ABSTRACT

A method of inspecting a display device and a method of manufacturing a display device are provided. The display includes a substrate, a light emitting element on the substrate, a first contact electrode on one end of the light emitting element, and a second contact electrode spaced from the first contact electrode and on an other end of the light emitting element. The method of inspecting the display device includes applying a first inspection voltage and a second inspection voltage to the first contact electrode and the second contact electrode, respectively, and measuring a first inspection current, and while applying the first inspection voltage and the second inspection voltage to the first contact electrode and the second contact electrode, respectively, irradiating the light emitting element with inspection light and measuring a second inspection current.

20 Claims, 18 Drawing Sheets

METHOD OF INSPECTING DISPLAY DEVICE AND METHOD OF MANUFACTURING DISPLAY DEVICE

This application claims priority to and the benefit of Korean Patent Application No. 10-2020-0150123, filed on Nov. 11, 2020 in the Korean Intellectual Property Office, the entire content of which is hereby incorporated by reference.

BACKGROUND

1. Field

The present disclosure relates to a method of inspecting a display device and a method of manufacturing a display device.

2. Description of Related Art

The importance of a display device has increased with the development of multimedia. Accordingly, various types of display devices such as an organic light emitting diode (OLED) display and a liquid crystal display (LCD) have been used.

A display device is a device for displaying an image, and includes a display panel such as a light emitting display panel or a liquid crystal display panel. Among them, the light emitting display panel may include a light emitting element such as a light emitting diode (LED). In this case, examples of the light emitting diode (LED) may include an organic light emitting diode (OLED) using an organic material as a fluorescent and/or phosphorescent material and an inorganic light emitting diode using an inorganic material as a fluorescent and/or phosphorescent material.

SUMMARY

An aspect of embodiments of the present disclosure is to provide a method of inspecting a display device, in which inspection time is shortened and inspection efficiency is improved.

According to an aspect of embodiments of the present disclosure, there is provided a method of inspecting a display device including a substrate, a light emitting element on the substrate, a first contact electrode on one end of the light emitting element, and a second contact electrode spaced from the first contact electrode and on an other end of the light emitting element, the method including: applying a first inspection voltage and a second inspection voltage to the first contact electrode and the second contact electrode, respectively, and measuring a first inspection current; and while applying the first inspection voltage and the second inspection voltage to the first contact electrode and the second contact electrode, respectively, irradiating the light emitting element with inspection light and measuring a second inspection current.

In an embodiment, the method includes calculating an inspection current change, the inspection current change being an amount of change between the first inspection current and the second inspection current; and determining a contact failure between the light emitting element and the first and second contact electrodes based on the calculated inspection current change.

In an embodiment, the method includes determining that a contact between the light emitting element and the first and second contact electrodes is defective in case the inspection current change is smaller than a reference current change; and determining that the contact between the light emitting element and the first and second contact electrodes is normal in case the inspection current change is greater than or equal to the reference current change.

In an embodiment, the inspection current change is a value obtained by subtracting the first inspection current from the second inspection current.

In an embodiment, the inspection current change is a value obtained by subtracting the first inspection current from the second inspection current.

In an embodiment, the inspection light includes light of a short wavelength band having high energy.

In an embodiment, the inspection light includes ultraviolet light.

In an embodiment, the light emitting element includes a first semiconductor layer at the other end of the light emitting element, a second semiconductor layer at the one end of the light emitting element, and a light emitting layer between the first semiconductor layer and the second semiconductor layer.

In an embodiment, the first semiconductor layer includes an n-type semiconductor layer, and the second semiconductor layer includes a p-type semiconductor layer.

In an embodiment, when the inspection light is irradiated, electrons move toward the first semiconductor layer in the light emitting element, and holes move toward the second semiconductor layer in the light emitting element, so that a photocurrent is generated in the light emitting element.

In an embodiment, the display device further includes a first electrode and a second electrode on the substrate and spaced from each other, and the one end of the light emitting element is on the first electrode, and the other end of the light emitting element is on the second electrode.

In an embodiment, the first contact electrode is on the first electrode to contact the first electrode, and the second contact electrode is on the second electrode to contact the second electrode.

In an embodiment, the display device further includes a first transistor electrically connected to the first electrode, a first voltage line electrically connected to the first transistor, and a second voltage line electrically connected to the second electrode, and the first inspection current and the second inspection current are measured as a current flowing through the second voltage line.

In an embodiment, the first inspection voltage is applied to the first contact electrode through the first voltage line, and the second inspection voltage is applied to the second contact electrode through the second voltage line.

According to another aspect, there is provided a method of manufacturing a display device, the method including: forming a first contact electrode at one end of a light emitting element on a substrate, and a second contact electrode spaced from the first contact electrode and at an other end of the light emitting element; applying a first inspection voltage and a second inspection voltage to the first contact electrode and the second contact electrode, respectively, and measuring a first inspection current; while applying the first inspection voltage and the second inspection voltage to the first contact electrode and the second contact electrode, respectively, irradiating the light emitting element with inspection light having high energy and measuring a second inspection current; calculating an inspection current change, which is an amount of change between the first inspection current and the second inspection current; and determining a contact failure between the light emitting element and the first and second contact electrodes based on the inspection current change.

In an embodiment, the method of manufacturing the display device includes determining that contact between the light emitting element and the first and second contact electrodes is defective in case the inspection current change is smaller than a reference current change; and determining that the contact between the light emitting element and the first and second contact electrodes is normal in case the inspection current change is greater than or equal to the reference current change.

In an embodiment, the light emitting element includes a first semiconductor layer at the other end of the light emitting element, a second semiconductor layer at the one end of the light emitting element, and a light emitting layer between the first semiconductor layer and the second semiconductor layer, and the first semiconductor layer includes an n-type semiconductor layer, and the second semiconductor layer includes a p-type semiconductor layer.

In an embodiment, when the inspection light is irradiated, electrons move toward the first semiconductor layer in the light emitting element, and holes move toward the second semiconductor layer in the light emitting element, so that a photocurrent is generated in the light emitting element.

In an embodiment, the display device further includes a first electrode and a second electrode on the substrate and spaced from each other, and the one end of the light emitting element is on the first electrode, and the other end of the light emitting element is on the second electrode.

In an embodiment, the display device further includes a first transistor electrically connected to the first electrode, a first voltage line electrically connected to the first transistor, and a second voltage line electrically connected to the second electrode, and the first inspection current and the second inspection current are measured as a current flowing through the second voltage line.

However, aspects of embodiments of the present disclosure are not limited to the one set forth herein. The above and other aspects of embodiments of the present disclosure will become more apparent to one of ordinary skill in the art to which the present disclosure pertains by referencing the detailed description of the present disclosure given below.

BRIEF DESCRIPTION OF THE DRAWINGS

The above and other aspects and features of the present disclosure will become more apparent by describing in detail embodiments thereof with reference to the attached drawings, in which.

DETAILED DESCRIPTION

Figure 1:
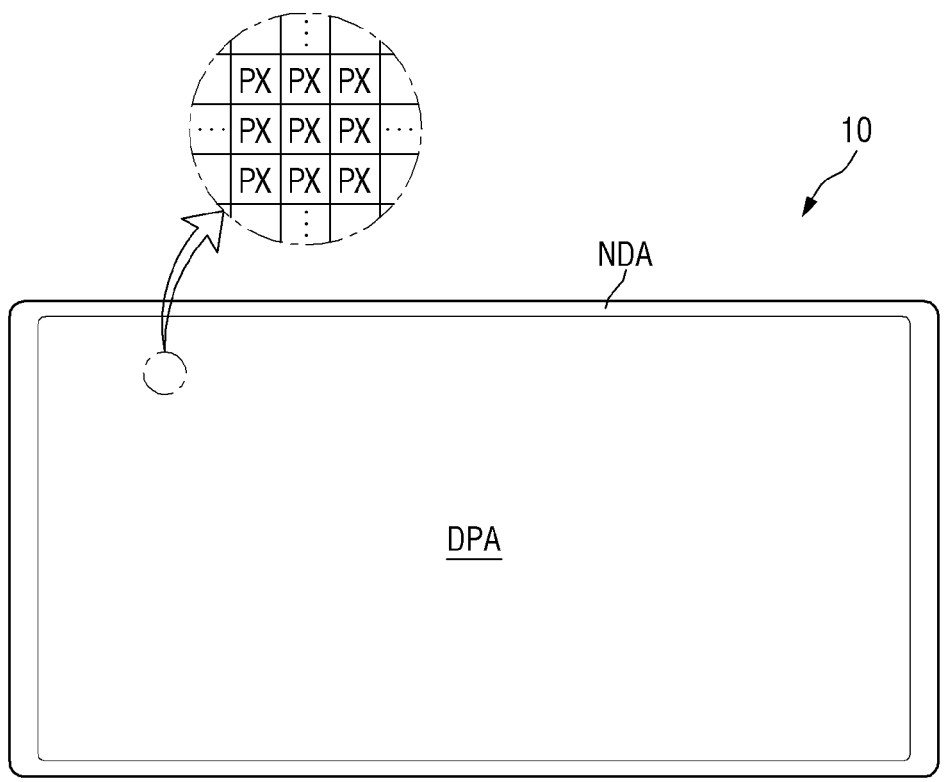
FIG. 1 is a schematic plan view of a display device according to an embodiment.
Figure 1:
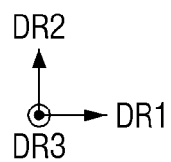

The present disclosure will now be described more fully hereinafter with reference to the accompanying drawings, in which embodiments of the present disclosure are shown. The present disclosure may, however, be embodied in different forms and should not be construed as limited to the embodiments set forth herein. Rather, these embodiments are provided so that the present disclosure will be thorough and complete, and will fully convey the scope of the present disclosure to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element.

Spatially relative terms, such as "beneath", "below", "lower", "under", "above", "upper" and the like, may be used herein for ease of description to describe one element or feature's relationship to another element(s) or feature(s) as illustrated in the figures. It will be understood that such spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the present disclosure. As used herein, the terms "substantially," "about," and similar terms are used as terms of approximation and not as terms of degree, and are intended to account for the inherent deviations in measured or calculated values that would be recognized by those of ordinary skill in the art.

As used herein, the singular forms "a" and "an" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the present disclosure refers to "one or more embodiments of the present disclosure". Also, the term "exemplary" is intended to refer to an example or illustration. As used herein, the terms "use," "using," and "used" may be considered synonymous with the terms "utilize," "utilizing," and "utilized," respectively.

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein.

Hereinafter, embodiments of the present disclosure will be described with reference to the attached drawings.

FIG. 1 is a schematic plan view of a display device according to an embodiment.

Referring to FIG. 1, a display device 10 displays a mobile image or a still image. The display device 10 may refer to any electronic device that provides a display screen. Examples of the display device 10 may include televisions, notebook computers, monitors, billboards, Internet of Things (IoTs), mobile phones, smart phones, tablet personal computers (tablet PCs), electronic watches, smart watches, watch phones, head mount displays, mobile communication terminals, electronic notebooks, electronic books, portable multimedia players (PMPs), navigators, game machines, digital cameras, and camcorders.

The display device 10 includes a display panel for providing a display screen. Examples of the display panel may include an inorganic light emitting diode display panel, an organic light emitting display panel, a quantum dot light emitting display panel, a plasma display panel, and a field emission display panel. Hereinafter, a case where an inorganic light emitting diode display panel is used as the display panel will be described as an example, but the present disclosure is not limited thereto. Other display panels may be applied as long as the same technical spirit is applicable.

In the drawings of embodiments for explaining the display device 10, a first direction DR1, a second direction DR2, and a third direction DR3 are defined. The first direction DR1 and the second direction DR2 may be directions perpendicular to each other in one plane. The third direction DR3 may be a direction perpendicular to the plane in which the first direction DR1 and the second direction DR2 are located. The third direction DR3 is perpendicular to each of the first direction DR1 and the second direction DR2. In embodiments explaining the display device 10, the third direction DR3 represents a thickness direction (or display direction) of the display device 10.

The display device 10 may have a rectangular shape in which sides in the first direction DR1 is longer than sides in the second direction DR2 in a plan view. In a plan view, the corner of the display device 10 where the long side meets the short side may be right-angled, but is not limited thereto, and may have a rounded curved shape. The shape of the display device 10 is not limited to those provided as examples, and may be variously changed. For example, the display device 10 may have a shape such as a square, a rectangle having rounded corners (vertexes), a polygon, or a circle in a plan view.

The display surface of the display device 10 may be disposed at one side of the third direction DR3 which is a thickness direction. In the embodiments for explaining the display device 10, unless otherwise stated, the "upper" refers to a display direction toward one side in the third direction DR3, likewise the "upper surface" refers to a surface facing one side in the third direction DR3. The "lower" refers to a direction opposite to the display direction toward the other side in the third direction DR3, and the "lower surface" refers to a surface facing the other side in the third direction DR3. Here, the surface facing the other side is in reference to "a surface facing one side." Further, the "left", "right", "upper", and "lower" refer to directions when the display device 10 is viewed on the plane. For example, the "right side" refers to one side in the first direction DR1, the "left side" refers to the other side in the first direction DR1, the "upper side" refers to one side in the second direction DR2, and the "lower side" refers to the other side in the second direction DR2.

The display device 10 may include a display area DPA and a non-display area NDA surrounding the display area DPA along the edge or periphery of the display area DPA. The display area DPA is an area where an image is displayed, and the non-display area NDA is an area where an image is not displayed.

The shape of the display area DPA may follow the shape of the display device 10. For example, the display area DPA may have a planar rectangular shape similar to the overall shape of the display device 10. The display area DPA may generally occupy the center (or a central area) of the display device 10.

The display area DPA may include a plurality of pixels PX. The plurality of pixels PX may be arranged along a matrix direction (e.g., the plurality of pixels PX may be arranged along rows and columns). The shape of each of the pixels PX may be rectangular or square in a plan view. In an embodiment, each pixel PX may include a plurality of light emitting elements made of inorganic particles.

The non-display area NDA may be disposed around the display area DPA. The non-display area NDA may entirely or partially surround the display area DPA. The non-display area NDA may constitute a bezel of the display device 10. The non-display area NDA may be provided with lines, circuit drivers, or a pad unit on which an external device is mounted.

Figure 2:
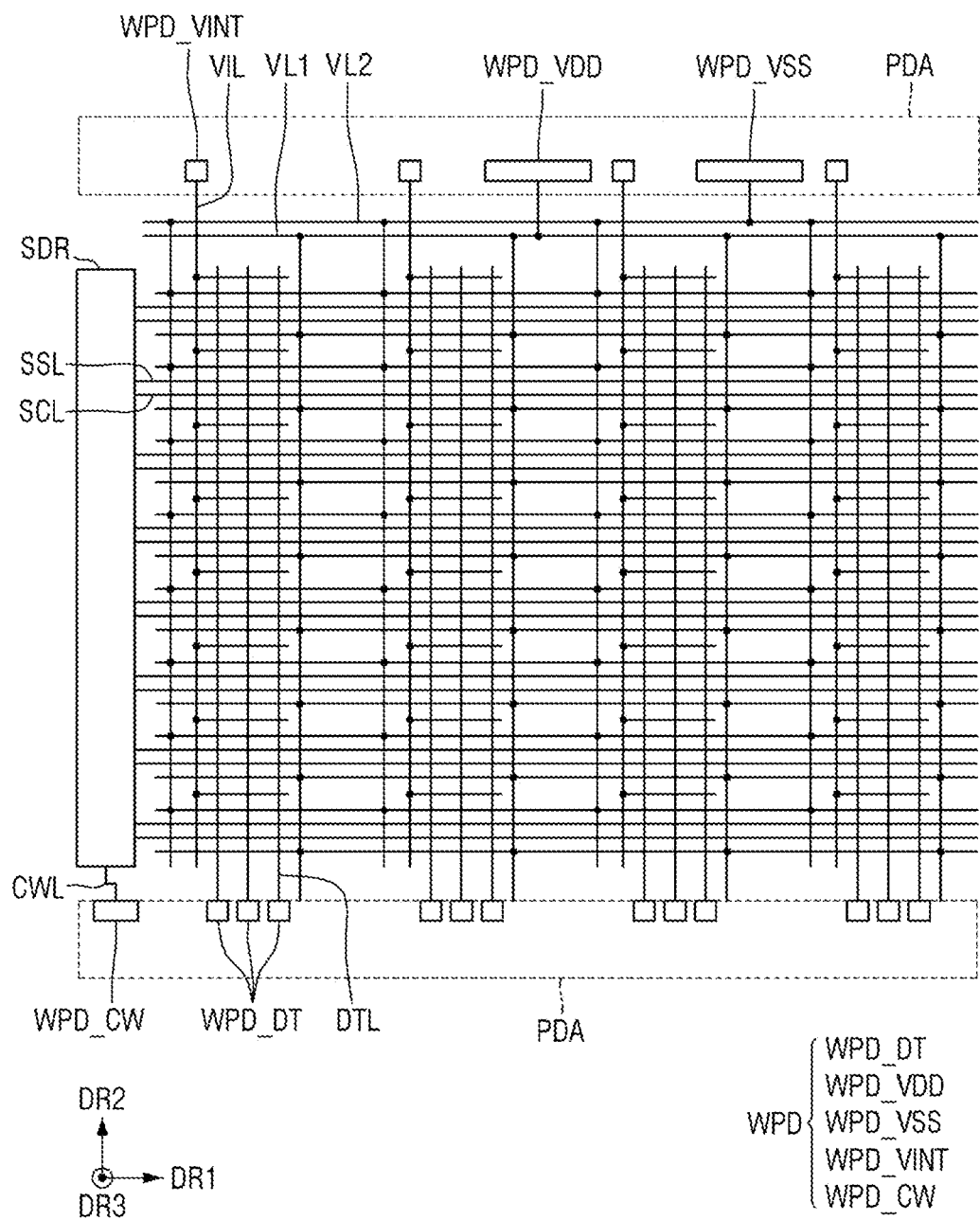
FIG. 2 is a schematic layout view of lines included in a display device according to an embodiment.

FIG. 2 is a schematic layout view of lines included in a display device according to an embodiment.

Referring to FIG. 2, the display device 10 may include a plurality of lines. The plurality of lines may include a scan line SCL, a sensing line SSL, a data line DTL, an initialization voltage line VIL, a first voltage line VL1, and a second voltage line VL2. Although not shown in the drawing, the display device 10 may be provided with other lines.

As used herein, the 'connection' may mean that not only any one member is connected to another member through physical contact with each other, but also connected to another member through still another member. Further, it may be understood that one portion and the other portion of one integrated member are connected to each other. Moreover, it may be interpreted that the connection between any one member and another member includes direct contact connection and electrical connection through still another member.

The scan line SCL and the sensing line SSL may extend in the first direction DR1. The scan line SCL and the sensing line SSL may be connected to a scan driver SDR. The scan driver SDR may include a driving circuit. The scan driver SDR may be disposed in the non-display area NDA. In an embodiment, the scan driver SDR may be disposed in the non-display area NDA adjacent to the first short side (left side in FIG. 1) of the display device 10, but the present disclosure is not limited thereto. The scan driver SDR is connected to a signal connection line CWL, and at least one end of the signal connection line CWL may be connected to an external device by forming a wiring pad WPD_CW on the non-display area NDA.

The data line DTL and the initialization voltage line VIL may extend in the second direction DR2 crossing the first direction DR1. The initialization voltage line VIL may further include a portion branched in the first direction DR1 in addition to the portion extending in the second direction DR2.

The first voltage line VL1 and the second voltage line VL2 may extend in the second direction DR2. Each of the first voltage line VL1 and the second voltage line VL2 may further include a portion extending in the first direction DR1. Each of the first voltage line VL1 and the second voltage line VL2 may have a mesh structure, but the structure thereof is not limited thereto.

Although not shown in the drawing, each of the pixels PX of the display device 10 may be connected to at least one data line DTL, an initialization voltage line VIL, a first voltage line VL1, and a second voltage line VL2.

The data line DTL, the initialization voltage line VIL, the first voltage line VL1, and the second voltage line VL2 may be electrically connected to at least one wiring pad WPD. Each wiring pad WPD may be disposed in a pad area PDA included in the non-display area NDA. The pad areas PDA may be disposed in the non-display area NDA adjacent to the first long side (upper side in FIG. 1) of the display device 10 and the non-display area NDA disposed adjacent to the second long side (lower side in FIG. 1) of the display device 10.

In one embodiment, the wiring pad (WPD_DT, hereinafter referred to as "data pad") of the data line DTL may be disposed in the underlying pad area PDA, and the wiring pad (WPD_VINT, hereinafter referred to as 'initialization voltage pad') of the initialization voltage line VIL, the wiring pad (WPD_VDD, hereinafter referred to as "first voltage pad") of the first voltage line VL1, and the wiring pad (WPD_VSS, hereinafter referred to as "second voltage pad") of the second voltage line VL2 may be disposed in the overlying pad area PDA. As another example, the data pad WPD_DT, the initialization voltage pad WPD_VINT, the first voltage pad WPD_VDD, and the second voltage pad WPD_VSS may all be disposed in the same area, that is, the overlying pad area PDA. An external device may be mounted on the wiring pad WPD. The external device may be mounted on the wiring pad WPD through an anisotropic conductive film, ultrasonic bonding, or the like. Further, during the process of inspecting whether the display device 10 has a contact failure, a current measuring device of an inspection apparatus is electrically connected to the wiring pad WPD of the display device 10 to measure current or apply a voltage.

Each pixel PX or each sub-pixel SPX (SPX1, SPX2, or SPX3) of the display device 10 includes a pixel driving circuit. The above-described lines may apply a driving signal to each pixel driving circuit while passing through each pixel PX or a periphery thereof. The pixel driving circuit may include a transistor and a capacitor. The number of transistors and capacitors in each pixel driving circuit may be variously changed. Each sub-pixel SPX of the display device 10 according to an embodiment may have a 3T1C structure in which a pixel driving circuit includes three transistors and one capacitor. Hereinafter, a case where the pixel driving circuit included in the display device 10 has a 3T1C structure will be described as an example, but the present disclosure is not limited thereto, and various other modified pixel structures such as a 2T1C structure, a 7T1C structure, and a 6T1C structure may also be applied.

Figure 3:
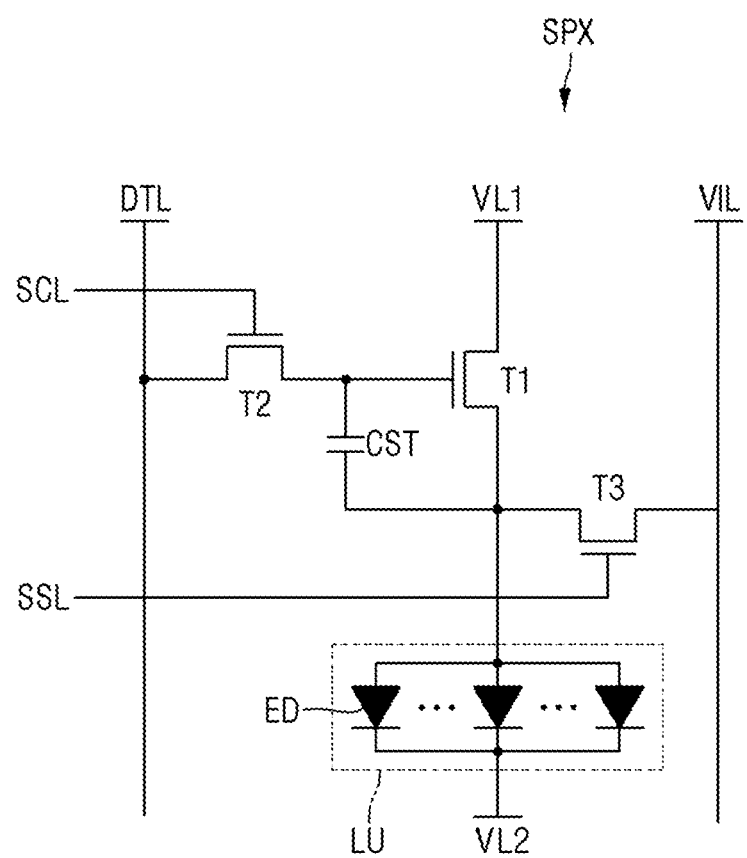
FIG. 3 is an equivalent circuit diagram of one sub-pixel of a display device according to an embodiment.

FIG. 3 is an equivalent circuit diagram of one sub-pixel of a display device according to an embodiment.

Referring to FIG. 3, each sub-pixel SPX of the display device 10 according to an embodiment may include a light source unit LU, a plurality of transistors T1, T2, and T3, and a storage capacitor CST. The plurality of transistors T1, T2, and T3 may include a first transistor T1, a second transistor T2, and a third transistor T3.

The light source unit LU emits light according to a current supplied through the first transistor T1. The light source unit LU may include a first electrode, a second electrode, and at least one light emitting element ED arranged between the first electrode and the second electrode and connected in parallel to each other. The light emitting element ED may emit light of a specific wavelength band by electric signals transmitted from the first electrode and the second electrode.

Meanwhile, although it is shown in the drawing that the plurality of light emitting elements ED included in the light source unit LU are arranged in the same direction and connected in parallel to each other, the present disclosure is not limited thereto. For example, some of the plurality of light emitting elements ED and others thereof may be arranged in opposite directions to each other.

One end of the light source unit LU may be connected to a source electrode of the first transistor T1, and the other end thereof may be connected to the second voltage line VL2 to which a low-potential voltage (hereinafter, a second power voltage) lower than a high-potential voltage (hereinafter, a first power voltage) of the first voltage line VL1 is supplied. For example, one end of the light emitting element ED included in the light source unit LU may be connected to the source electrode of the first transistor T1 through a first electrode of the light source unit LU, and the other end of the light emitting element ED may be connected to the second voltage line VL2 through a second electrode of the light source unit LU.

The first transistor T1 adjusts a current flowing from the first voltage line VL1, to which the first power voltage is supplied, to the light source unit LU according to a difference in voltage between a gate electrode and a source electrode. For example, the first transistor T1 may be a driving transistor for driving the light source unit LU. The gate electrode of the first transistor T1 may be connected to the second source/drain electrode of the second transistor T2, the source electrode of the first transistor T1 may be connected to the first electrode of the light source unit LU, and the drain electrode of the first transistor T1 may be connected to the first voltage line VL1 to which the first power voltage is applied.

The second transistor T2 is turned on by a scan signal of the scan line SCL to connect the data line DTL to the gate electrode of the first transistor T1. The gate electrode of the second transistor T2 may be connected to the scan line SCL, the second source/drain electrode of the second transistor T2 may be connected to the gate electrode of the first transistor T1, and the first source/drain electrode of the second transistor T2 may be connected to the data line DTL.

The third transistor T3 is turned on by a sensing signal of the sensing line SSL to connect the initialization voltage line VIL to the source electrode of the first transistor T1. The gate electrode of the third transistor T3 may be connected to the sensing line SSL, and the first source/drain electrode of the third transistor T3 may be connected to the initialization voltage line VIL, and the second source/drain electrode of the third transistor T3 may be connected to the source electrode of the first transistor T1.

In an embodiment, the first source/drain electrode of each of the second and third transistors T2 and T3 may be a source electrode, and the second source/drain electrode thereof may be a drain electrode, but the present disclosure is not limited thereto, and vice versa.

The storage capacitor CST is formed between the gate electrode of the first transistor T1 and the source electrode of the first transistor T1. The storage capacitor CST stores a difference voltage between the gate voltage and source voltage of the first transistor T1.

Each of the first to third transistors T1, T2, and T3 may be formed as a thin film transistor. Although it is shown in FIG. 3 that the first to third transistors T1, T2, and T3 are formed as N-type MOSFETs (Metal Oxide Semiconductor Field Effect Transistors), the present disclosure is not limited thereto. That is, the first to third transistors T1, T2, and T3 may be formed as P-type MOSFETs, or some of the first to third transistors T1, T2, and T3 may be formed as N-type MOSFETs and others thereof may be formed as P-type MOSFETs.

Figure 4:
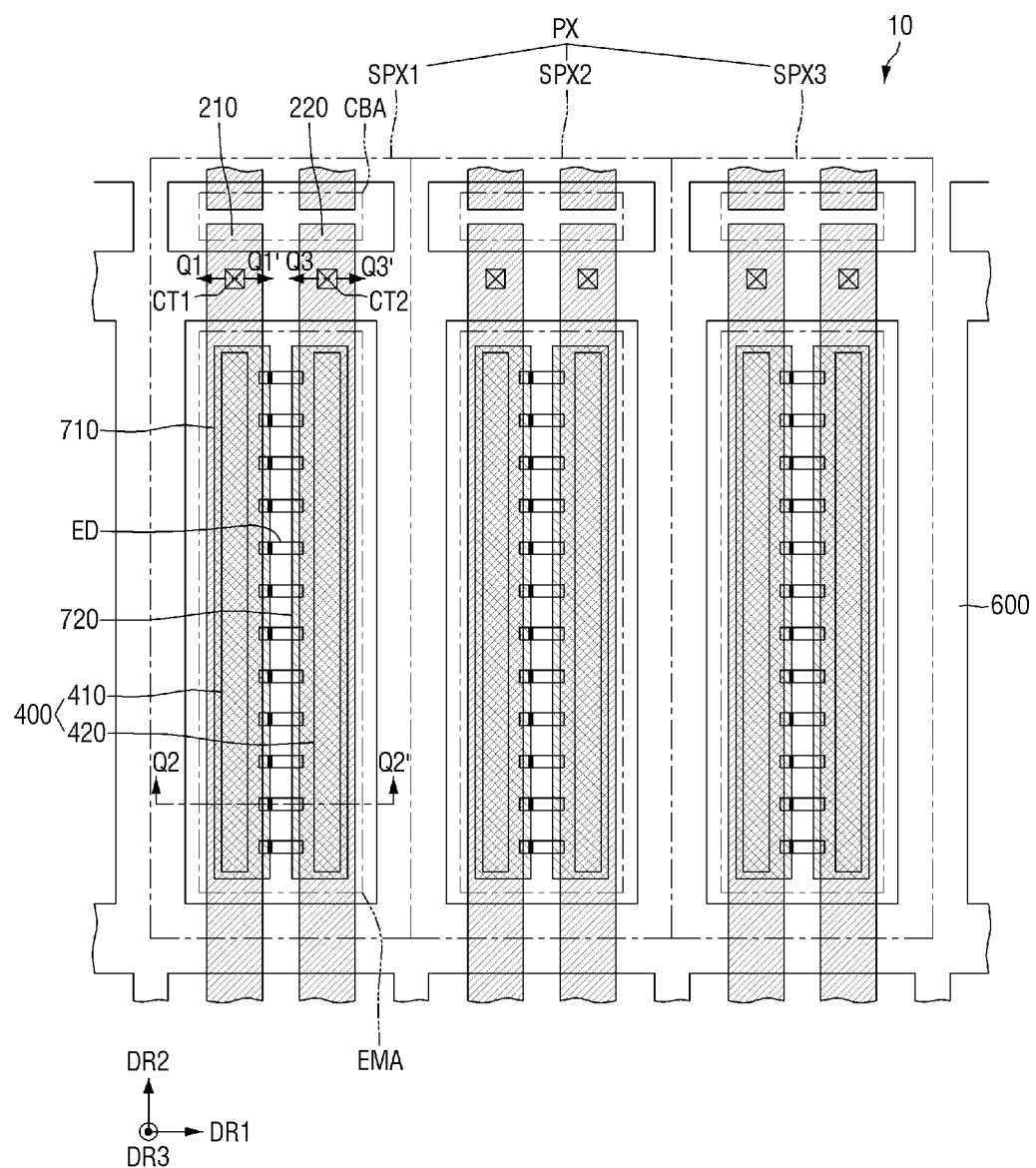
FIG. 4 is a schematic plan view of one pixel of a display device according to an embodiment.
Figure 5:
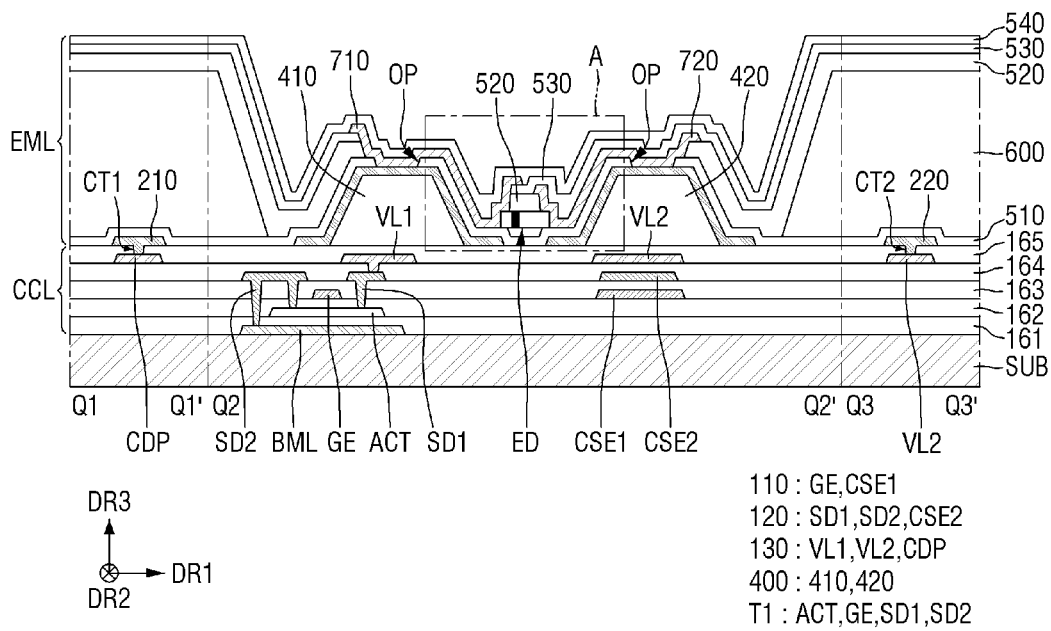
FIG. 5 is a cross-sectional view taken along the lines Q1-Q1', Q2-Q2', and Q3-Q3' of FIG. 4.

FIG. 4 is a schematic plan view of one pixel of a display device according to an embodiment. FIG. 5 is a cross-sectional view taken along the lines Q1-Q1', Q2-Q2', and Q3-Q3' of FIG. 4.

Referring to FIG. 4, each pixel PX may include a plurality of sub-pixels (SPX: SPX1, SPX2, SPX3). For example, one pixel PX may include a first sub-pixel SPX1, a second sub-pixel SPX2, and a third sub-pixel SPX3. The first sub-pixel SPX1 may emit light of a first color, the second sub-pixel SPX2 may emit light of a second color, and the third sub-pixel SPX3 may emit light of a third color. The first color may be blue, the second color may be green, and the third color may be red. However, the present disclosure is not limited thereto, and the sub-pixels SPX may emit light of the same color. Although it is shown in FIG. 4 that each pixel PX includes three sub-pixels SPX1, SPX2, and SPX3, the present disclosure is not limited thereto, and each pixel PX may include a larger number of sub-pixels SPX.

Each of the sub-pixels SPX of the display device 10 may include a light emission area EMA and a non-light emission area. The light emission area EMA may be defined as an area through which light emitted from the light emitting element ED is output, and the non-light emission area may be defined as an area in which light emitted from the light emitting element ED does not reach and thus light is not output.

The light emission area EMA may include an area in which the light emitting element ED is disposed and an area adjacent thereto. The light emission area EMA may further include an area in which light emitted from the light emitting element ED is reflected or refracted by another member and is output.

Each sub-pixel SPX may further include a cut-out area CBA disposed in the non-light emission area. The cut-out area CBA may be disposed at the upper side (or one side in the second direction DR2) of the light emission area EMA in one sub-pixel SPX. The cut-out area CBA may be disposed between the light emission areas EMA of the sub-pixel SPX neighboring in the second direction DR2.

The light emission areas EMA of each sub-pixel SPX included in one pixel PX may be arranged to be spaced from each other along the first direction DR1. Similarly, the cut-out areas CBA of each sub-pixel SPX included in one pixel PX may be arranged to be spaced from each other in the first direction DR1. While the light emission areas EMA may be arranged to be spaced from each other along the first direction DR1, and the cut-out areas CBA may be arranged to be spaced from each other along the first direction DR1, the light emission areas EMA and the cut-out areas CBA may be alternately arranged along the second direction DR2.

The cut-out area CBA may be an area in which electrodes 210 and 220 included in the sub-pixels SPX adjacent to each other along the second direction DR2 are separated from each other. The electrodes 210 and 220 disposed for each sub-pixel SPX may be separated from each other in the cut-out area CBA, and parts of the electrodes 210 and 220 disposed for each sub-pixel SPX may be disposed in the cut-out area CBA. The light emitting element ED may not be disposed in the cut-out area CBA.

Referring to FIG. 5, the display device 10 may include a substrate SUB, a circuit layer CCL disposed on the substrate SUB, and a light emitting element layer EML disposed on the circuit layer CCL. The circuit layer CCL includes a buffer layer 161, a lower metal layer BML, a semiconductor layer, a plurality of conductive layers, a plurality of insulating layers, and a via layer 165, which are arranged on the substrate SUB. The light emitting element layer EML may be disposed on the via layer 165 of the circuit layer CCL, and may include first and second electrodes 210 and 220, a first bank 400, a light emitting element ED, first and second contact electrodes 710 and 720, a plurality of insulating layers 510, 520, 530, and 540, and a second bank 600.

The substrate SUB may be an insulating substrate. The substrate SUB may be made of an insulating material such as glass, quartz, or polymer resin. The substrate SUB may be a rigid substrate, but may also be a flexible substrate capable of bending, folding, rolling, and the like.

The circuit layer CCL may be disposed on the substrate SUB. The circuit layer CCL may include at least one transistor or the like to drive a light emitting element layer EML.

The lower metal layer BML may be disposed on the substrate SUB. The lower metal layer BML has a patterned shape. The lower metal layer BML may be disposed to overlap an active layer ACT of the first transistor T1 of the display device 10 in the third direction DR3. The lower metal layer BML may be a light blocking layer serving to protect the semiconductor layer from external light. The lower metal layer BML may include a light blocking material. For example, the lower metal layer BML may be formed of an opaque metal material that blocks light transmission. The lower metal layer BML may be omitted.

The buffer layer 161 may be disposed on the lower metal layer BML. The buffer layer 161 may be disposed to cover the entire surface of the substrate SUB on which the lower metal layer BML is disposed. The buffer layer 161 may serve to protect a transistor from moisture penetrating through the substrate SUB vulnerable to moisture permeation. The buffer layer 161 may be formed of a plurality of inorganic layers alternately stacked. For example, the buffer layer 161 may be formed as multiple layers in which inorganic layers including at least one of silicon oxide (SiOx), silicon nitride (SiNx), and silicon oxynitride (SiOxNy) are alternately stacked.

The semiconductor layer may be disposed on the buffer layer 161. The semiconductor layer may include an active layer ACT of the first transistor T1. The active layer ACT of the first transistor T1 may be disposed to overlap the lower metal layer BML and a gate electrode GE of the first transistor T1 to be described later in the third direction DR3.

The semiconductor layer may include polycrystalline silicon, an oxide semiconductor, or the like. In an embodiment, when the semiconductor layer includes polycrystalline silicon, the semiconductor layer may be formed by crystallizing amorphous silicon. In another embodiment, the semiconductor layer may include an oxide semiconductor. Examples of the oxide semiconductor may include indium-tin oxide (ITO), indium-zinc oxide (IZO), indium-gallium oxide (IGO), indium-zinc-tin Oxide (IZTO), indium-gallium-zinc oxide (IGZO), indium-gallium-tin oxide (IGTO), and indium-gallium-zinc-tin oxide (IGZTO).

The gate insulating layer 162 may be disposed on the semiconductor layer, which may include the active layer ACT, and the buffer layer 161. The gate insulating layer 162 may function as a gate insulating layer of each of the transistors.

The first conductive layer 110 may be disposed on the gate insulating layer 162. The first conductive layer 110 may include a gate electrode GE of the first transistor T1 and a first capacitive electrode CSE1 of the storage capacitor CST. The gate electrode GE may be disposed to overlap a channel region of the active layer ACT of the first transistor T1 in the third direction DR3. The first capacitive electrode CSE1 of the storage capacitor CST may be disposed to overlap a second capacitive electrode CSE2 of the storage capacitor CST, which will be described later, in the third direction DR3.

A first interlayer insulating layer 163 is disposed on the first conductive layer 110. The first interlayer insulating layer 163 may function as an insulating layer between the first conductive layer 110 and other layers disposed thereon. Further, the first interlayer insulating layer 163 may be disposed to cover the first conductive layer 110, and may function to protect the first conductive layer 110. The first interlayer insulating layer 163 may include an inorganic insulating material such as silicon oxide (SiOx), silicon nitride (SiNx), or silicon oxynitride (SiOxNy).

The second conductive layer 120 is disposed on the interlayer insulating layer 163. The second conductive layer 120 may include a drain electrode SD1 and source electrode SD2 of the first transistor T1 and a second capacitive electrode CSE2 of the storage capacitor CST. Although not shown in the drawing, the second conductive layer 120 may further include a data line connected to each sub-pixel SPX.

The drain electrode SD1 and source electrode SD2 of the first transistor T1 may be in contact with both end regions of the active layer ACT of the first transistor T1 through a corresponding contact hole penetrating the first interlayer insulating layer 163 and the gate insulating layer 162.

Further, the source electrode SD2 of the first transistor T1 may be electrically connected to the lower metal layer BML through a contact hole penetrating the interlayer insulating layer 163, the gate insulating layer 162, and the buffer layer 161. In some embodiments, the second capacitive electrode CSE2 of the storage capacitor CST and the source electrode SD2 of the first transistor T1 may be integrally formed into one layer. A portion of the integrated layer may include the second capacitive electrode CSE2, and the other portion thereof may include the source electrode SD2 of the first transistor T1.

The second interlayer insulating layer 164 is disposed on the second conductive layer 120. The second interlayer insulating layer 164 may function as an insulating layer between the second conductive layer 120 and other layers disposed thereon. Further, the second interlayer insulating layer 164 may be disposed to cover the second conductive layer 120, and may function to protect the second conductive layer 120. The second interlayer insulating layer 164 may include an inorganic insulating material such as silicon oxide (SiOx), silicon nitride (SiNx), or silicon oxynitride (SiOxNy).

The third conductive layer 130 is disposed on the second interlayer insulating layer 164. The third conductive layer 130 includes a first voltage line VL1, a second voltage line VL2, and a conductive pattern CDP.

A high-potential voltage (or a first power voltage) supplied to the first transistor T1 may be applied to the first voltage line VL1, and a low-potential voltage (or a second power voltage) supplied to the second electrode 220 may be applied to the second voltage line VL2. The first voltage line VL1 may contact the drain electrode SD1 of the first transistor T1 through a contact hole penetrating the second interlayer insulating layer 164.

The conductive pattern CDP may be electrically connected to the source electrode SD2 of the first transistor T1. Although not shown in the drawings, the conductive pattern CDP may contact the source electrode SD2 of the first transistor T1 through a contact hole penetrating the second interlayer insulating layer 164. The conductive pattern CDP may be electrically connected to the first electrode 210 through a first contact hole CT1, which will be described later, to transmit the first power voltage applied from the first voltage line VL1 to the first electrode 210.

The via layer 165 is disposed on the third conductive layer 130. The via layer 165 may perform a surface planarization function of flattening a step formed by the underlying layers. The via layer 165 may include an organic insulating material, for example, an organic material such as polyimide (PI).

Hereinafter, a structure of the light emitting element layer EML disposed on the via layer 165 of the circuit layer CCL will be described in detail with reference to FIGS. 4 and 5.

A first bank 400 may be disposed on the circuit layer CCL. The first bank 400 may be disposed on the via layer 165 of the circuit layer CCL. The first bank 400 has a shape extending in the second direction DR2 in each sub-pixel SPX in a plan view. The first bank 400 may include first and second sub-banks 410 and 420 spaced from each other in the first direction DR1. The space formed by the first and second sub-banks 410 and 420 being spaced from each other may provide an area in which a plurality of light emitting elements ED are arranged.

Each of the first and second sub-banks 410 and 420 may include a structure in which at least a portion thereof protrudes from the upper surface of the substrate SUB. The protrusion portion of each of the first and second sub-banks 410 and 420 may have an inclined surface. Because each of the first and second sub-banks 410 and 420 includes the inclined side surface, the traveling direction of light emitted from the light emitting element ED and traveling toward the side surface of each of the first and second sub-banks 410 and 420 may be changed to an upward direction (for example, a display direction). In other words, the light emitted from the light emitting element ED and traveling toward the side surface of each of the first and second sub-banks 410 and 410 may be reflected to travel in the upward direction.

The first and second electrodes 210 and 220 may be disposed on the first and second sub-banks 410 and 420, respectively. The first and second electrodes 210 and 220 may be disposed to be spaced from each other in the first direction DR1.

The first electrode 210 may extend in the second direction DR2 in a plan view so as to overlap a portion of the second bank 600 extending in the first direction DR1 (e.g., see, FIG. 4). The first electrode 210 may be electrically connected to the conductive pattern CDP through the first contact hole CT1 penetrating the via layer 165.

The second electrode 220 may extend in the second direction DR2 in a plan view so as to overlap a portion of the second bank 600 extending in the first direction DR1 (e.g., see, FIG. 4). The second electrode 220 may be electrically connected to the second voltage line VL2 through the second contact hole CT2.

The first electrode 210 may be electrically connected to the first transistor T1 through the conductive pattern CDP to apply a first power voltage, and the second electrode 220 may be electrically connected to the second voltage line VL2 to apply a second power voltage.

The first and second electrodes 210 and 220 may be electrically connected to the light emitting elements ED, and a suitable voltage (e.g., a set or predetermined voltage) may be applied thereto such that the light emitting elements ED emit light. For example, the plurality of electrodes 210 and 220 are electrically connected to the light emitting element ED disposed between the first electrode 210 and the second electrode 220 through contact electrodes 710 and 720 to be described later, and may transmit electrical signals applied to the electrodes 210 and 220 to the light emitting element ED through the contact electrodes 710 and 720.

Each of the first and second electrodes 210 and 220 may include a conductive material having high reflectance. For example, each of the first and second electrodes 210 and 220 may include a metal such as silver (Ag), copper (Cu), or aluminum (Al), or may include an alloy containing aluminum (Al), nickel (Ni), or lanthanum (La), as the conductive material having high reflectance. Each of the first and second electrodes 210 and 220 may reflect light emitted from the light emitting element ED and traveling toward the side surface of the first bank 400 in a display direction (for example, third direction DR3).

However, the present disclosure is not limited thereto, and each of the first and second electrodes 210 and 220 may further include a transparent conductive material. For example, each of the first and second electrodes 210 and 220 may include a material such as ITO, IZO, or ITZO. In some embodiments, each of the first and second electrodes 210 and 220 may have a structure in which one or more transparent conductive material layers and one or more metal layers having high reflectance are stacked, or may be formed as one layer including these layers. For example, each of the first and second electrodes 210 and 220 may have a stacked structure of ITO/Ag/ITO/, ITO/Ag/IZO, or ITO/Ag/ITZO/IZO.

The first insulating layer 510 is disposed on the plurality of electrodes 210 and 220 and the first bank 400. The first insulating layer 510 is disposed on the first electrode 210 and the second electrode 220, but may be disposed to expose at least a portion of each of the first electrode 210 and the second electrode 220. In an embodiment, the first insulating layer 510 may be provided with an opening OP that exposes a portion of the upper surface of the first electrode 210 disposed on the first sub-bank 410 and another opening OP that exposes a portion of the upper surface of the second electrode 220 disposed on the second sub-bank 420. The first contact electrode 710 to be described later may contact the first electrode 210 through the opening OP penetrating the first insulating layer 510, and the second contact electrode 720 to be described later may contact the second electrode 220 through the opening OP penetrating the first insulating layer 510.

The first insulating layer 510 may protect the first electrode 210 and the second electrode 220 and insulate them from each other. Further, the first insulating layer 510 may prevent the light emitting element ED disposed on the first insulating layer 510 from being damaged by direct contact with other members.

The second bank 600 is disposed on the first insulating layer 510. The second bank 600 may be disposed in a grid pattern by including portions extending in the first direction DR1 and the second direction DR2 in a plan view (e.g., see, FIG. 4). The second bank 600 may be disposed across the boundary of the respective sub-pixels SPX to distinguish neighboring sub-pixels SPX, and may be disposed to surround the light emission area EMA and the cut-out area CBA in each sub-pixel SPX to define the light emission area EMA and the cut-out area CBA.

The second bank 600 may be formed to have a height greater than that of the first bank 400. The second bank 600 may perform a function of preventing ink from overflowing to the adjacent pixel PX or sub-pixel SPX in the inkjet printing process of a process of manufacturing the display device 10.

The light emitting element ED may be disposed on the first insulating layer 510 between the electrodes 210 and 220. The light emitting element ED may have a shape extending in one direction, and both ends of the light emitting element ED may be placed on the first electrode 210 and the second electrode 220, respectively. A direction in which the electrodes 210 and 220 extend may be substantially perpendicular to a direction in which the light emitting element ED extends. However, the present disclosure is not limited thereto, and some of the plurality of light emitting elements ED may be arranged such that the direction in which the light emitting element ED extends is substantially perpendicular to the direction in which the first and second electrodes 210 and 220 extend, and other ones of the plurality of light emitting elements ED may be arranged such that the direction in which the light emitting element ED extends is oblique to the direction in which the first and second electrodes 210 and 220 extend.

The second insulating layer 520 may be partially disposed on the light emitting element ED. The second insulating layer 520 may be disposed to partially surround the outer surface (e.g., an outer peripheral surface) of the light emitting element ED, but may be disposed so as not to cover both ends of the light emitting element ED.

Further, the second insulating layer 520 may also be disposed on the first bank 400 and the second bank 600. The second insulating layer 520, in addition to the light emitting element ED, may be disposed on the first insulating layer 510 and the second bank 600 in the light emission area EMA, but may be disposed to expose a portion of the first insulating layer 510 disposed on the side surfaces of the first and second sub-banks 410 and 420 facing (or opposing) each other, together with both ends of the light emitting element ED.

The shape of the second insulating layer 520 may be formed through an etching process in which a second insulating material layer is entirely deposited on the substrate SUB to cover the first insulating layer 510, the light emitting element ED, and the second bank 600, and both ends of the light emitting element ED and regions adjacent thereto are exposed through subsequent processes during the process of manufacturing the display device 10.

A portion of the second insulating layer 520 disposed on the light emitting element ED may be disposed to extend in the second direction DR2 on the first insulating layer 510 in a plan view, thereby forming a linear pattern or an island-shaped pattern within each sub-pixel SPX. The second insulating layer 520 may serve to protect the light emitting element ED and to fix the light emitting element ED in the process of manufacturing the display device 10.

The first and second contact electrodes 710 and 720 may be disposed on the second insulating layer 520. Each of the first and second contact electrodes 710 and 720 may have a shape extending in one direction in a plan view. Each of the first contact electrode 710 and the second contact electrode 720 may have a shape extending in the second direction DR2 in a plan view (e.g., see, FIG. 4). The first contact electrode 710 and the second contact electrode 720 may be spaced from each other and face (or oppose) each other in the first direction DR1. The first contact electrode 710 and the second contact electrode 720 may form a stripe pattern in the light emission area EMA of each sub-pixel SPX.

The first contact electrode 710 may be disposed on the first electrode 210, and the second contact electrode 720 may be disposed on the second electrode 220.

A portion of the first contact electrode 710 may be in contact with the first electrode 210 exposed through the opening OP of the first insulating layer 510, and another portion of the first contact electrode 710 may be in contact with one end of the light emitting element ED exposed by the second insulating layer 520. The first contact electrode 710 may serve to electrically connect the light emitting element ED and the first electrode 210 by contacting one end of the light emitting element ED and the first electrode 210. The first contact electrode 710 may extend from one end of the light emitting element ED toward a third insulating layer 530 to be described later, and may thus be disposed on a portion of the third insulating layer 530.

A portion of the second contact electrode 720 may be in contact with the second electrode 220 exposed through the opening OP of the first insulating layer 510, and another portion of the second contact electrode 720 may be in contact with the other end of the light emitting element ED exposed by the second insulating layer 520. The second contact electrode 720 may serve to electrically connect the light emitting element ED and the second electrode 220 by contacting the other end of the light emitting element ED and the second electrode 220. The second contact electrode 720 may extend from the other end of the light emitting element ED toward the second insulating layer 520, and may thus be disposed on a portion of the second insulating layer 520.

Each of the first and second contact electrodes 710 and 720 may include a conductive material. For example, each of the first and second contact electrodes 710 and 720 may include ITO, IZO, ITZO, or aluminum (Al). As an example, each of the first and second contact electrodes 710 and 720 may include a transparent conductive material, but the material thereof is not limited thereto.

The third insulating layer 530 is disposed on the second contact electrode 720. For example, the third insulating layer 530, in addition to the second contact electrode 720, may be disposed on the second insulating layer 520 except for an area in which the first contact electrode 710 is disposed. The third insulating layer 530 may electrically insulate the first contact electrode 710 and the second contact electrode 720 from each other. The third insulating layer 530 is disposed to cover the second contact electrode 720, but may not be disposed on one end of the light emitting element ED such that the light emitting element ED may contact the first contact electrode 710.

In an embodiment, the first contact electrode 710 and the second contact electrode 720 may be disposed on different layers from each other. A portion of the second contact electrode 720 is directly disposed on the second insulating layer 520 disposed on the light emitting element ED, and a portion of the first contact electrode 710 may be directly disposed on the third insulating layer 530. However, the present disclosure is not limited thereto, and in some other embodiments, the first contact electrode 710 and the second contact electrode 720 may be disposed on the same layer, e.g., on the second insulating layer 520.

The fourth insulating layer 540 may be entirely disposed on the substrate SUB. The fourth insulating layer 540 may function to protect members disposed on the substrate SUB from external environments.

Figure 6:
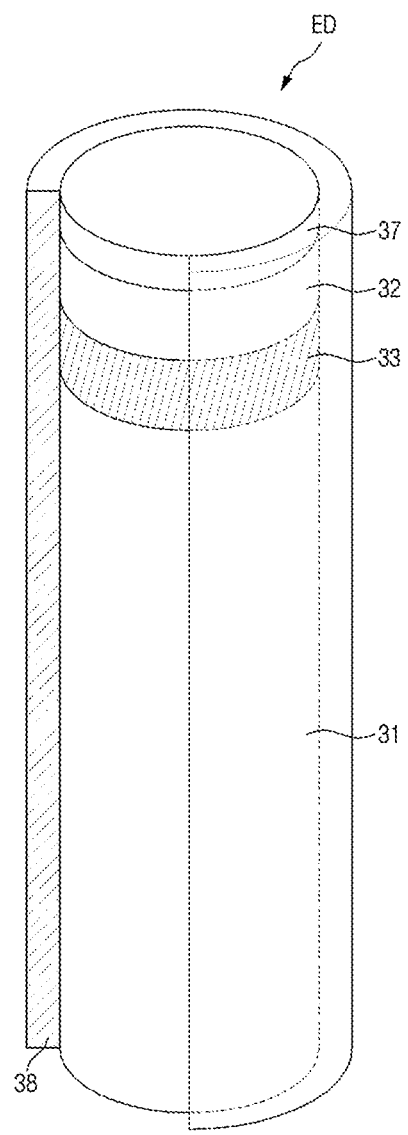
FIG. 6 is a schematic view of a light emitting element according to an embodiment.

FIG. 6 is a schematic view of a light emitting element according to an embodiment.

Referring to FIG. 6, the light emitting element ED is a particulate element, and may have a rod shape or a cylindrical shape having a suitable aspect ratio (e.g., a set or predetermined aspect ratio). The length of the light emitting element ED is larger than the diameter of the light emitting element ED, and the aspect ratio thereof may be 1.2:1 to 100:1, but is not limited thereto.

The light emitting element ED may have a size of a nano-meter scale (1 nm or more and less than 1 μm) to a micrometer scale (1 μm or more and less than 1 mm). In an embodiment, both diameter and length of the light emitting element ED may have a size of a nanometer scale, or may have a size of a micrometer scale. In some embodiments, the diameter of the light emitting element ED may have a size of a nanometer scale, while the length of the light emitting element ED may have a size of a micrometer scale. In some embodiments, some of the light emitting elements ED may have a size of a nanometer scale in diameter and/or length, while other ones of the light emitting elements ED may have a size of a micrometer scale in diameter and/or length.

The light emitting element ED may include an inorganic light emitting diode. The inorganic light emitting diode may include a plurality of semiconductor layers. For example, the inorganic light emitting diode may include a first conductive semiconductor layer (for example, an n-type semiconductor layer), a second conductive semiconductor layer (for example, a p-type semiconductor layer), and an active semiconductor layer interposed therebetween. The active semiconductor layer may receive holes and electrons from the first conductive semiconductor layer and the second conductive semiconductor layer, respectively, and the holes and electrons having reached the active semiconductor layer may be combined with each other to emit light.

In an embodiment, the above-described semiconductor layers may be sequentially stacked along the length direction of the light emitting element ED. As shown in FIG. 6, the light emitting element ED may include a first semiconductor layer 31, a light emitting layer 33, and a second semiconductor layer 32 that are sequentially stacked in the length direction. The first semiconductor layer 31, the light emitting layer 33, and the second semiconductor layer 32 may be the above-described first conductive semiconductor layer, active semiconductor layer, and second conductive semiconductor layer, respectively.

The first semiconductor layer 31 may be doped with a first conductive dopant. The first conductive dopant may be Si, Ge, Sn, or the like. In an embodiment, the first semiconductor layer 31 may be n-GaN doped with n-type Si.

The second semiconductor layer 32 may be disposed to be spaced from the first semiconductor layer 31 with the light emitting layer 33 interposed therebetween. The second semiconductor layer 32 may be doped with a second conductive dopant such as Mg, Zn, Ca, Se, or Ba. In an embodiment, the second semiconductor layer 32 may be p-GaN doped with p-type Mg.

The light emitting layer 33 may include a material having a single or multiple quantum well structure. As described above, the light emitting layer 33 may emit light by combination of an electron-hole pair according to an electrical signal applied through the first semiconductor layer 31 and the second semiconductor layer 32.

In some embodiments, the light emitting layer 33 may have a structure in which semiconductor materials having high band gap energy and semiconductor materials having low band gap energy are alternately stacked with each other, and may include other Group III to Group V semiconductor materials depending on the wavelength band of emitted light.

Light emitted from the light emitting layer 33 may be emitted not only to the outer surface of the light emitting element ED in the longitudinal direction, but also to both side surfaces thereof. That is, the direction of light emitted from the light emitting layer 33 is not limited to one direction.

The light emitting element ED may further include an electrode layer 37 disposed on the second semiconductor layer 32. The electrode layer 37 may be in contact with the second semiconductor layer 32. The electrode layer 37 may be an ohmic contact electrode, but is not limited thereto, and may be a Schottky contact electrode.

When both ends of the light emitting element ED is electrically connected to the contact electrodes 710 and 720 so as to apply electrical signals to the first and second semiconductor layers 31 and 32, the electrode layer 37 may be disposed between the second semiconductor layer 32 and the contact electrodes 710 and/or 720 to reduce resistance. The electrode layer 37 may include at least one of aluminum (Al), titanium (Ti), indium (In), gold (Au), silver (Ag), indium tin oxide (ITO), indium zinc oxide (IZO), and indium tin-zinc oxide (ITZO). The electrode layer 37 may include a semiconductor material doped with an n-type or p-type dopant.

The light emitting element ED may further include an insulating layer 38 surrounding the outer surface (e.g., an outer peripheral surfaces) of the first semiconductor layer 31, the second semiconductor layer 32, the light emitting layer 33 and/or the electrode layer 37. The insulating layer 38 may be disposed to surround at least an outer surface (e.g., an outer peripheral surfaces) of the light emitting layer 33 and may extend in one direction in which the light emitting element ED extends. The insulating layer 38 may perform a function of protecting the members of the light emitting elements ED. The insulating layer 38 is made of a material having insulating properties, and may prevent an electrical short that may occur when the light emitting layer 33 is in direct contact with an electrode through which an electrical signal is transmitted to the light emitting element ED. Further, because the insulating film 38 protects the outer surfaces (e.g., outer peripheral surfaces) of the first and second semiconductor layers 31 and 32 and the light emitting layer 33, it is possible to prevent a decrease in light emission efficiency.

Figure 7:
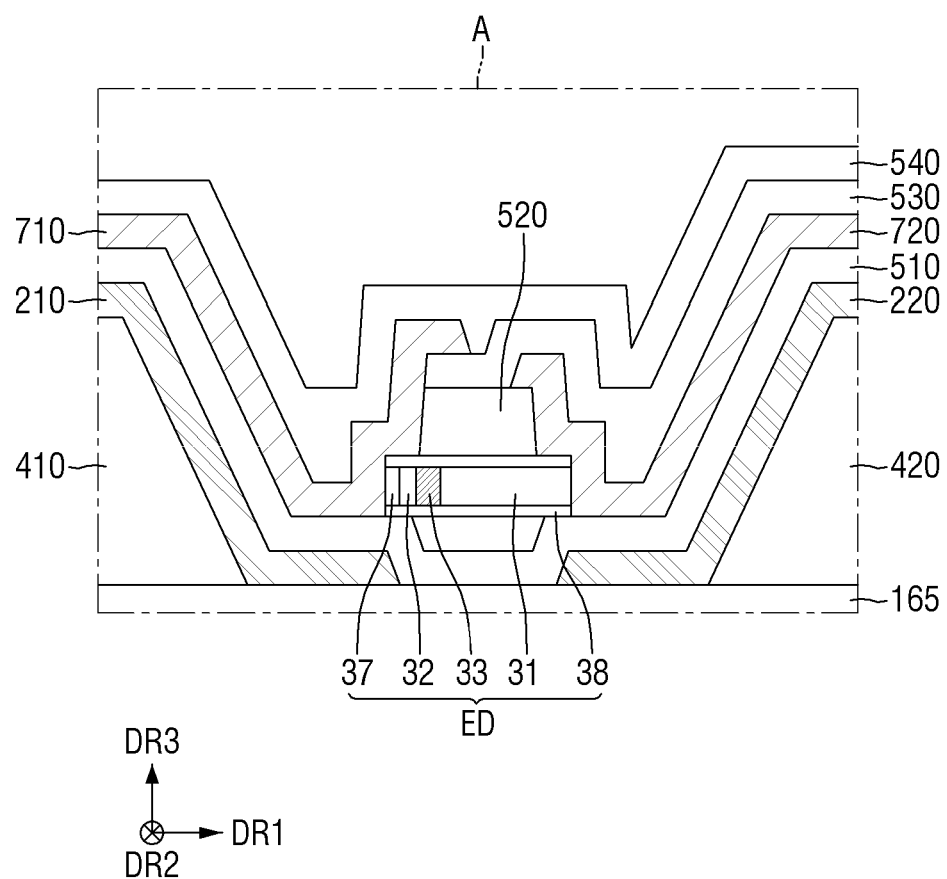
FIG. 7 is an enlarged view of the area A in FIG. 5.

FIG. 7 is an enlarged view of the area A of FIG. 5.

Hereinafter, a contact relationship between both ends of the light emitting element ED and the first and second contact electrodes 710 and 720 will be described with reference to FIGS. 6 and 7.

As described above, the light emitting element ED may include the semiconductor layers 31 and 32 doped with different conductivity type dopants. The light emitting element ED may include the plurality of semiconductor layers 31 and 32 and may be aligned such that one end of the light emitting element ED faces a specific direction according to the direction of an electric field generated between the electrodes 210 and 220. For example, the light emitting element ED may have a shape extending in one direction, and the first and second ends of the light emitting element ED in the extending direction may be disposed on the first electrode 210 and the second electrode 220, respectively.

For example, the light emitting element ED may be disposed such that one extending direction thereof is parallel to the substrate SUB, and the plurality of semiconductor layers included in the light emitting element ED may be sequentially disposed along a direction parallel to the upper surface of the substrate SUB.

One end of the light emitting element ED at which the second semiconductor layer 32 is located may be placed on the first electrode 210, and the other end of the light emitting element ED at which the first semiconductor layer 31 is located may be placed on the second electrode 220. However, the present disclosure is not limited thereto, and in some light emitting elements ED, one end of the light emitting element ED at which the second semiconductor layer 32 is located may be placed on the second electrode 220, and the other end of the light emitting element ED at which the first semiconductor layer 31 is located may be placed on the first electrode 210.

The first contact electrode 710 may contact one end of the light emitting element ED. The first contact electrode 710 may contact the electrode layer 37 disposed at one end of the light emitting element ED. The first contact electrode 710 may be electrically connected to the second semiconductor layer 32 through the electrode layer 37 of the light emitting element ED.

The second contact electrode 720 may contact the other end of the light emitting element ED. The second contact electrode 720 may contact the first semiconductor layer 31 disposed at the other end of the light emitting element ED.

One end of the light emitting element ED at which the second semiconductor layer 32 is located may be electrically connected to the first electrode 210 through the first contact electrode 710, and the other end of the light emitting element ED on which the first semiconductor layer 31 is located may be electrically connected to the second electrode 220 through the second contact electrode 720. That is, because both ends of the light emitting element ED contact the first contact electrode 710 and the second contact electrode 720, the light emitting element ED may receive electrical signals from the first and second electrodes 210 and 220, and light may be emitted from the light emitting layer 33 of the light emitting element ED according to the electrical signals.

In some embodiments, depending on the contact state between both ends of the light-emitting element ED and the first and second contact electrodes 710 and 720, characteristics such as luminance of each pixel PX or sub-pixel SPX of the display device 10 may be determined. For example, when the contact state between both ends of the light-emitting element ED and the first and second contact electrodes 710 and 720 is defective, an electrical signal is not transmitted to the semiconductor layer of the light emitting element ED, and thus the light emitting element ED may not emit light. In some embodiments, when the contact state between both ends of the light-emitting element ED and the first and second contact electrodes 710 and 720 is defective, the contact area between the contact electrode 710 and the light emitting element ED is small to increase resistance, so that the amount of light emitted from the light emitting element ED decreases, and thus luminance of each pixel PX may decrease. Accordingly, reliability of the display device 10 may be improved by inspecting the contact state between the light emitting element ED and contact electrodes 710 and 720 included in each pixel PX. In some embodiments, as the resolution of the display device 10 increases, the size of each pixel PX decreases, and thus, when the display device 10 is optically inspected, inspection reliability may decrease or inspection time may take too long. Accordingly, the inspection time may be shortened by detecting electrical characteristics and inspecting the contact state between the light emitting element ED and the contact electrodes 710 and 720 in the pixel PX of the display device 10. Hereinafter, an inspection apparatus for inspecting the contact state between the light emitting element ED and the contact electrodes 710 and 720 and an inspection method of inspecting the contact state between the light emitting element ED and the contact electrodes 710 and 720 will be described.

Figure 8:
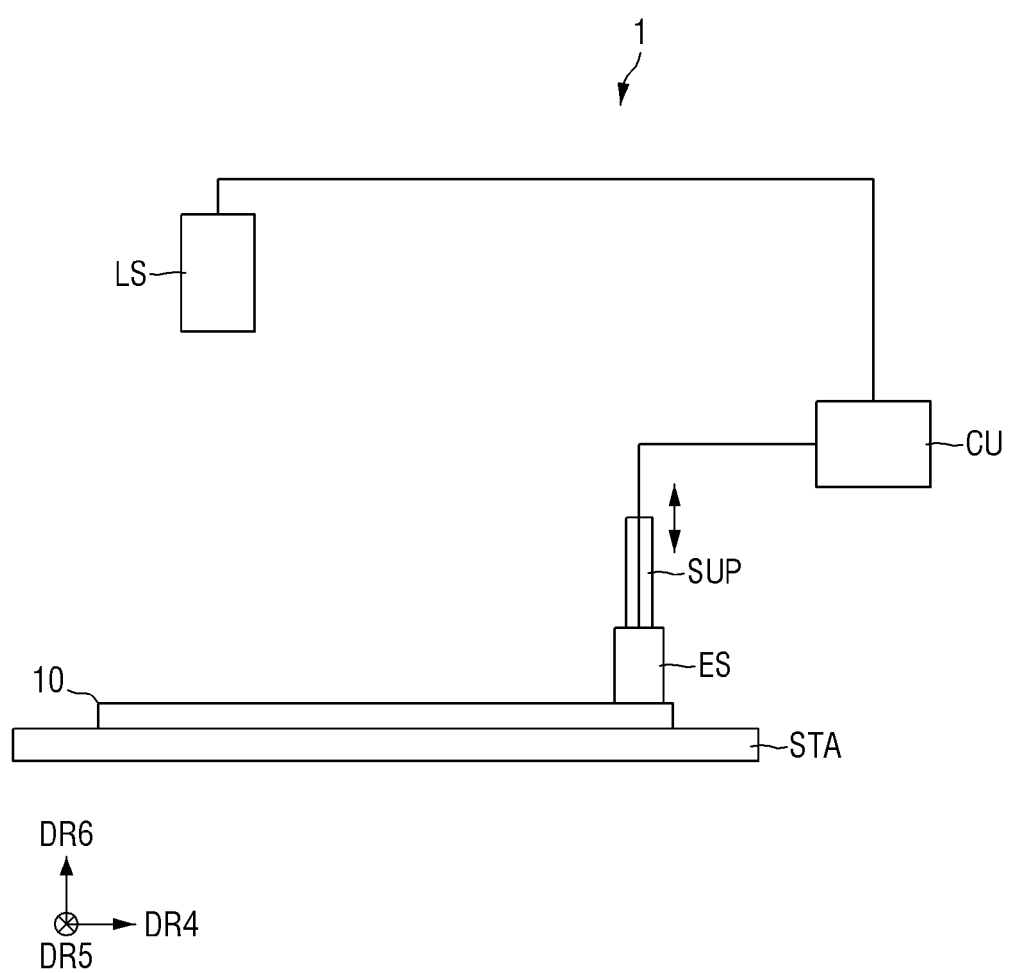
FIG. 8 is a schematic perspective view of an inspection apparatus for a display device according to an embodiment.

FIG. 8 is a schematic perspective view of an inspection apparatus for a display device according to an embodiment.

Referring to FIG. 8, an inspection apparatus 1 for inspecting whether the display device 10 according to an embodiment has a contact failure may include a stage STA, a light source member LS, a current measuring device ES, a moving unit SUP, and a control unit CU.

The stage STA provides a space in which the display device 10 is disposed in order to inspect whether the display device 10 has a contact failure. The display device 10 may be mounted on the stage STA while the process of inspecting whether the display device 10 has a contact failure is performed. The stage STA may be made of a quartz or ceramic material, and may be provided in the form of an electrostatic chuck, but the present disclosure is not limited thereto.

Hereinafter, in FIG. 8, the inspection apparatus 1 for inspecting the contact failure of the display device 10, a fourth direction DR4, a fifth direction DR5, and a sixth direction DR6 are defined. The fourth direction DR4 and the fifth direction DR5 may be directions perpendicular to each other in one plane. The sixth direction DR6 may be a direction perpendicular to the plane in which the fourth direction DR4 and the fifth direction DR5 are located. The sixth direction DR6 is perpendicular to each of the fourth direction DR4 and the fifth direction DR5. In some embodiments of the inspection apparatus 1 for inspecting the contact of the display device 10 and the inspection method of inspecting the display device 10 using the same, the sixth direction DR6 indicates a direction in which the light source member LS is disposed, based on the stage STA.

The light source member LS may be disposed on the stage STA. The light source member LS is disposed above the stage STA (for example, one side in the sixth direction DR6) to emit inspection light L1 (refer to FIG. 12) toward the stage STA. In an embodiment, the inspection light L1 emitted from the light source member LS may include light of a short wavelength band having high energy. Details of the inspection light L1 emitted by the light source member LS will be described later.

The current measuring device ES may be disposed at one side of the stage STA. When the display device 10 is mounted on the stage STA, the current measuring device ES may be moved by the moving unit SUP to be disposed on the upper surface of the display device 10. The current measuring device ES may measure a current for each pixel PX or sub-pixel SPX of the display device 10 while the contact inspection process of the display device 10 is performed, and may transmit the measured current data for each pixel PX or sub-pixel SPX to the control unit CU.

When the display device 10 is mounted on the stage STA and the current measuring device ES is disposed on the upper surface of the display device 10, the control unit CU applies a contact inspection reference signal to each pixel of the display device 10. The contact inspection reference signal includes a first inspection voltage applied to the first electrode 210 included in the display device 10 and a second inspection voltage applied to the second electrode 220 included in the display device 10.

For example, referring the inspection apparatus 1 of FIG. 8 in conjunction with FIGS. 3 and 5, the first inspection voltage is supplied to the first voltage line VL1 connected to the drain electrode SD1 of the first transistor T1, and the second inspection voltage may be supplied to the second voltage line VL2. As described above, the first electrode 210 may be electrically connected to the source electrode SD2 of the first transistor T1 through the conductive pattern CDP, and the second electrode 220 may be electrically connected to the second voltage line VL2.

The control unit CU may supply the first inspection voltage to the first voltage line VL1 connected to the drain electrode SD1 of the first transistor T1, and may apply inspection signals to the scan line SCL and the data line DTL, so that the second transistor T2 may be turned on by the scan signal of the scan line SCL to connect the data line DTL to the gate electrode GE of the first transistor T1. Further, the control unit CU may supply the second inspection voltage to the second voltage line VL2. The first electrode 210 may be electrically connected to the source electrode SD2 of the first transistor T1, and thus the first inspection voltage supplied to the first voltage line VL1 may be applied to the first electrode 210. The second electrode 220 may be electrically connected to the second voltage line VL2, and thus the second inspection voltage may be applied to the second electrode 220. A suitable current (e.g., a set or predetermined current) may flow through each sub-pixel SPX of the display device 10 by the first inspection voltage and the second inspection voltage.

Further, the control unit CU may detect the sub-pixel SPX in which a contact failure has occurred based on the current data for each sub-pixel SPX measured by the current measuring device ES. Details thereof will be described later using other drawings.

Hereinafter, a method of inspecting the display device 10 using the contact inspection apparatus 1 for the display device of FIG. 8 will be described.

Figure 9:
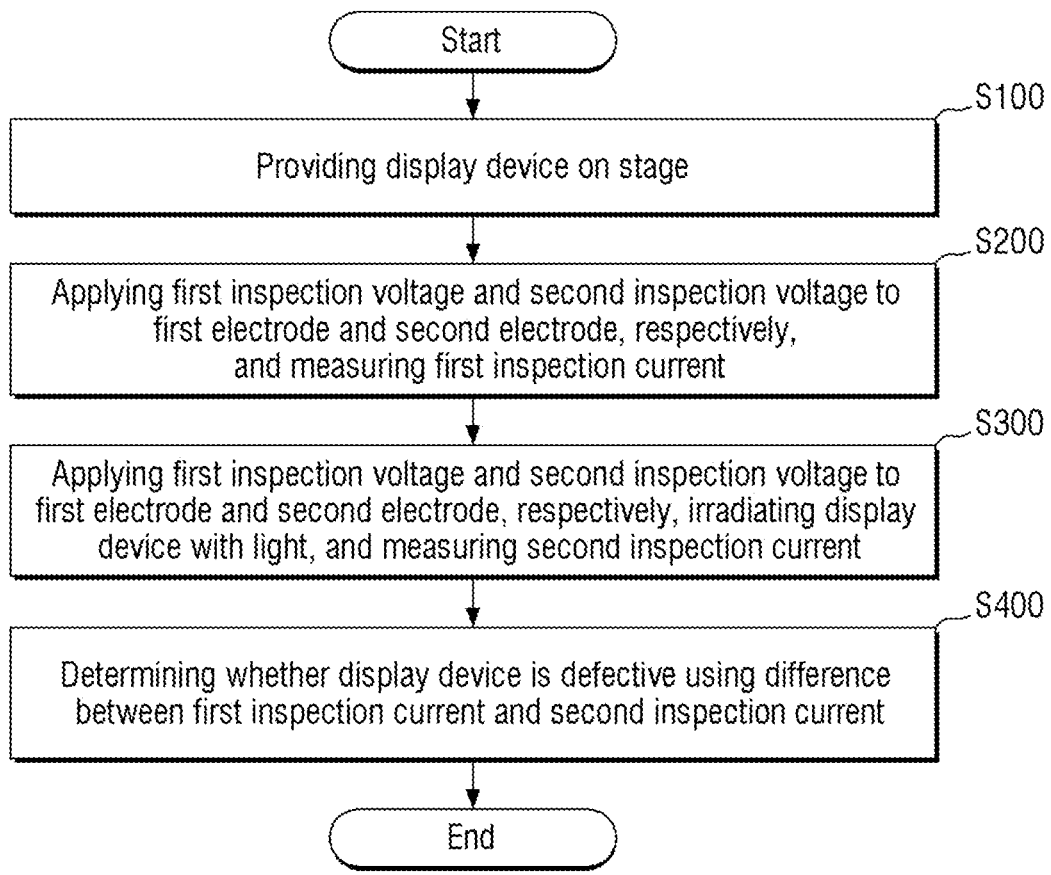
FIG. 9 is a flowchart illustrating a method of inspecting a display device according to an embodiment.

FIG. 9 is a flowchart illustrating a method of inspecting a display device according to an embodiment. FIGS. 10-15 are cross-sectional views illustrating the steps of an inspection process of a display device according to an embodiment.

Referring to FIG. 9, a method of inspecting a display device according to an embodiment includes the steps of: providing a display device on a stage (S100); applying a first inspection voltage and a second inspection voltage to a first electrode and a second electrode, respectively, and measuring a first inspection current (S200); applying a first inspection voltage and a second inspection voltage to the first electrode and the second electrode, respectively, irradiating the display device with light, and measuring a second inspection current (S300); and determining whether the display device has a contact failure based on a difference between the first inspection current and the second inspection current (S400).

First, a display device 10 is provided on a stage STA. (S100, FIG. 9).

Figure 10:
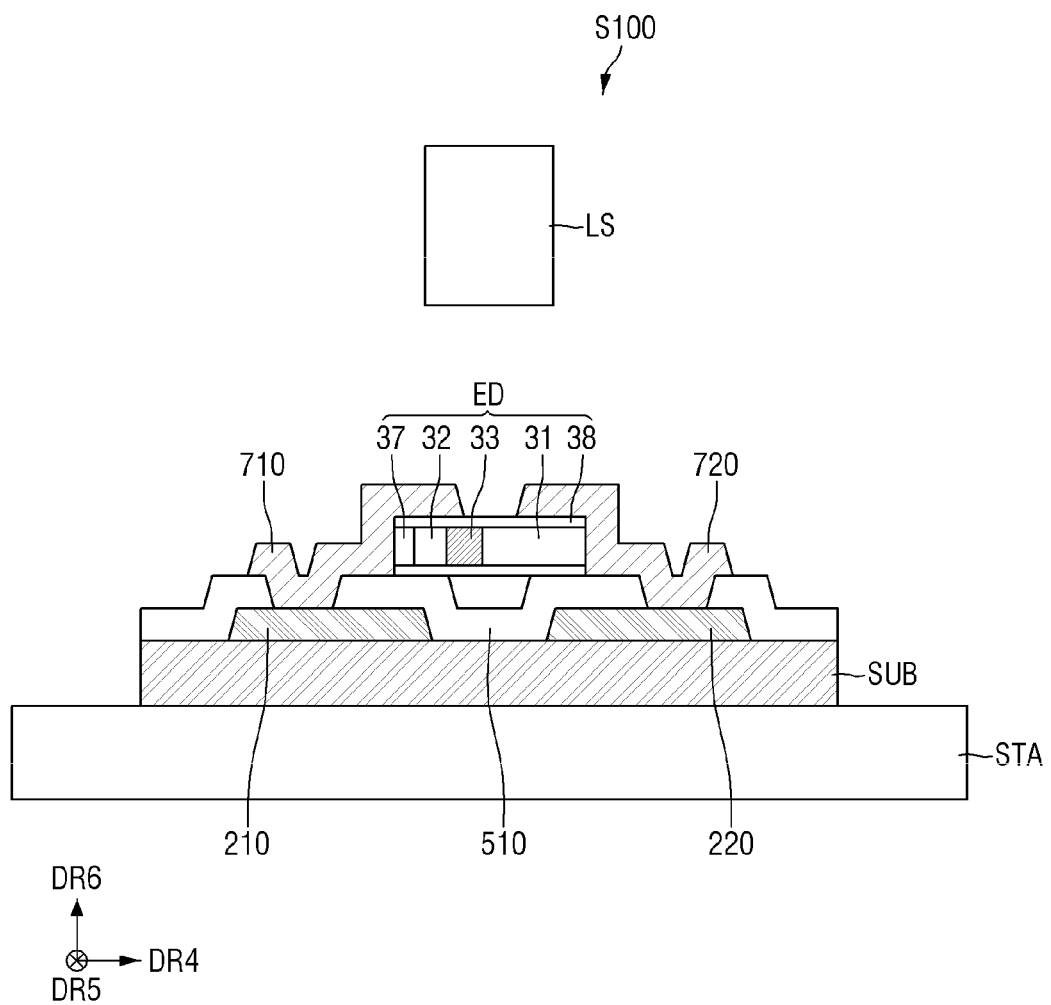
FIGS. 10-15 are cross-sectional views illustrating the steps of an inspection process of a display device according to an embodiment.

For example, referring to FIG. 10, a display device 10 is disposed on a stage STA of a contact inspection apparatus 1 in order to inspect the contact failure of the display device 10. The display device 10, which is a subject to be inspected for a contact failure, may include a substrate SUB, a first electrode 210, a second electrode 220, a first insulating layer 510, a light emitting element ED, a first contact electrode 710, and a second contact electrode 720.

For example, the first electrode 210 and the second electrode 220 may be spaced from each other on one surface of the substrate SUB in the fourth direction DR4. The first insulating layer 510 disposed on the first electrode 210 and the second electrode 220 may be disposed to expose at least a portion of the upper surface of the first electrode 210 and at least a portion of the upper surface of the second electrode 220. The light emitting element ED may be disposed on the first insulating layer 510 in a space between the first electrode 210 and the second electrode 220 spaced from each other. The first contact electrode 710 may be disposed on the first electrode 210 to make contact with the upper surface of the first electrode 210 exposed by the first insulating layer 510 and one end of the light emitting element ED. The second contact electrode 720 may be disposed on the second electrode 220 to be spaced from the first contact electrode 710 to make contact with the upper surface of the second electrode 220 exposed by the first insulating layer 510 and the other end of the light emitting element ED.

Subsequently, a first inspection voltage and a second inspection voltage are applied to the first electrode 210 and the second electrode 220, respectively, and a first inspection current I1 is measured (S200, FIG. 9).

Figure 11:
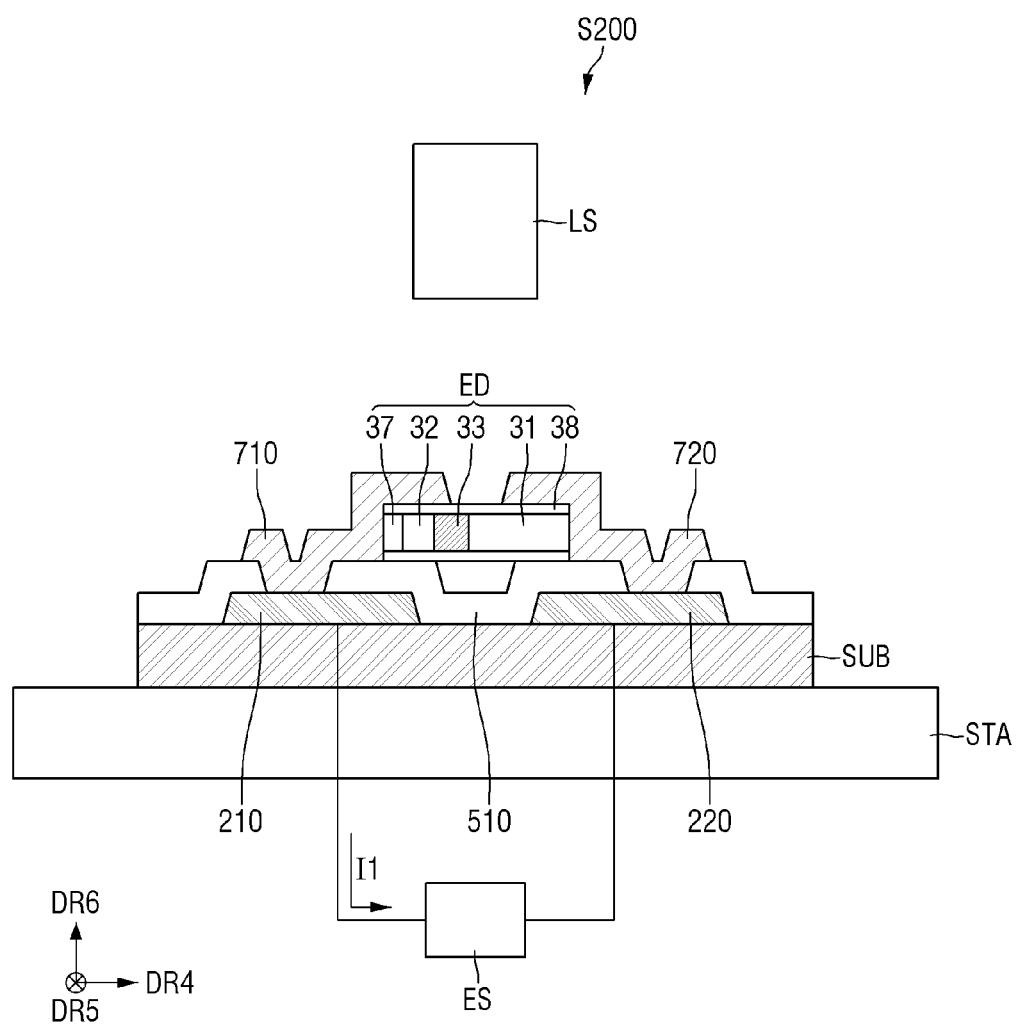

For example, referring to FIGS. 8 and 11, when the display device 10 is provided on the stage STA, the control unit CU of the inspection apparatus 1 for inspecting whether the display device 10 has a contact failure applies a first inspection voltage and a second inspection voltage to the first electrode 210 and second electrode 220 of the display device 10, respectively, such that a desired current (e.g., a set or predetermined current) flows along the light emitting element ED, the first contact electrode 710, first electrode 210, the second electrode 220, and the second contact electrode 720. Subsequently, a first inspection current I1, that is flowing along the first electrode 210, the first contact electrode 710, the light emitting element ED, the second contact electrode 720, and the second electrode 220 by applying the first inspection voltage and the second inspection voltage, is measured using a current measuring device ES.

For example, a method of applying the first inspection voltage and the second inspection voltage to the first electrode 210 and the second electrode 220, respectively, will be described in conjunction with FIG. 3.

The first inspection voltage may be supplied to the first voltage line VL1 connected to the drain electrode of the first transistor T1, and the second inspection voltage may be supplied to the second voltage line VL2. The first electrode 210 may be electrically connected to the source electrode of the first transistor T1, and the second electrode 220 may be electrically connected to the second voltage line VL2.

The control unit CU may supply the first inspection voltage to the first voltage line VL1 connected to the drain electrode of the first transistor T1, and may apply a scan signal to the scan line SCL to turn on the second transistor T2 to connect the data line DTL to the gate electrode of the first transistor T1. Further, the control unit CU may supply the second inspection voltage to the second voltage line VL2. The first electrode 210 may be electrically connected to the source electrode of the first transistor T1 to allow the first inspection voltage supplied to the first voltage line VL1 to be transmitted to the first electrode 210, and the second electrode 220 may be electrically connected to the second voltage line VL2 to allow the second inspection voltage supplied to the second voltage line VL2 to be transmitted to the second electrode 220. A first inspection current I1 may flow along the light emitting element ED, the first contact electrode 710, first electrode 210, the second electrode 220, and the second contact electrode 720 due to the voltage difference between the first inspection voltage and the second inspection voltage. Subsequently, the first inspection current I1 flowing along the first electrode 210, the first contact electrode 710, the light emitting element ED, the second contact electrode 720, and the second electrode 220 is measured using a current measuring device ES.

Subsequently, a first inspection voltage and a second inspection voltage are applied to the first electrode 210 and the second electrode 220, respectively, the display device 10 is irradiated with inspection light L1, and a second inspection current I2 is measured (S300, FIG. 9).

Figure 12:
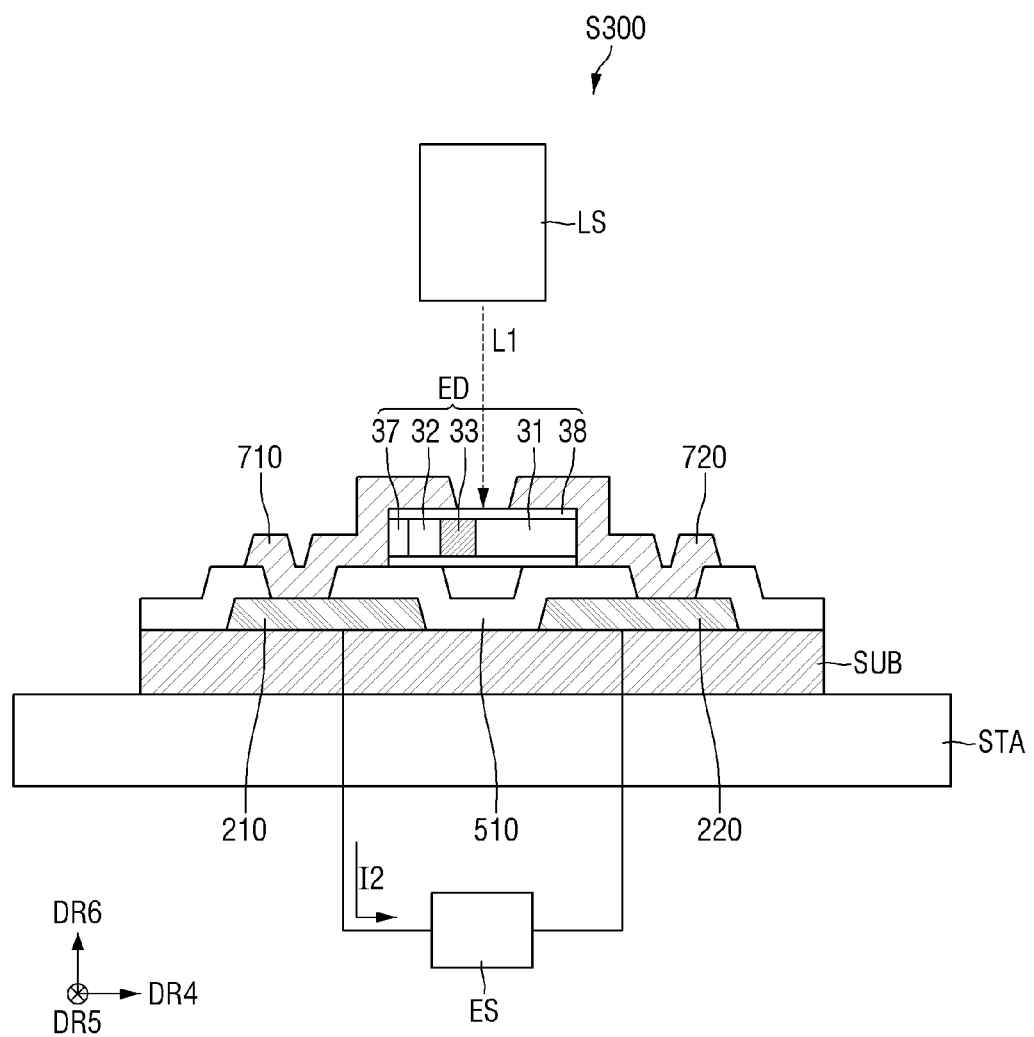

For example, referring to FIGS. 8 and 12, in a state in which a first inspection voltage and a second inspection voltage are applied to the first electrode 210 and the second electrode 220, respectively, the display device 10 may be irradiated thereon with inspection light L1 using the light source member LS. As described above, the inspection light L1 may include light of a short wavelength band having high energy. For example, the inspection light L1 may include an ultraviolet light, a high-energy laser beam, or the like.

Subsequently, the inspection light L1 is emitted from the light source member LS, and the second inspection current I2 flowing along the first electrode 210, the first contact electrode 710, the light emitting element ED, the second contact electrode 720, and the second electrode 220 by the first inspection voltage, the second inspection voltage, and the inspection light L1 is measured using a current measuring device ES.

Because the method of applying the first inspection voltage to the first electrode 210 and applying the second inspection voltage to the second electrode 220 is the same as that having been described above, a detailed description thereof will be omitted.

Figure 13:
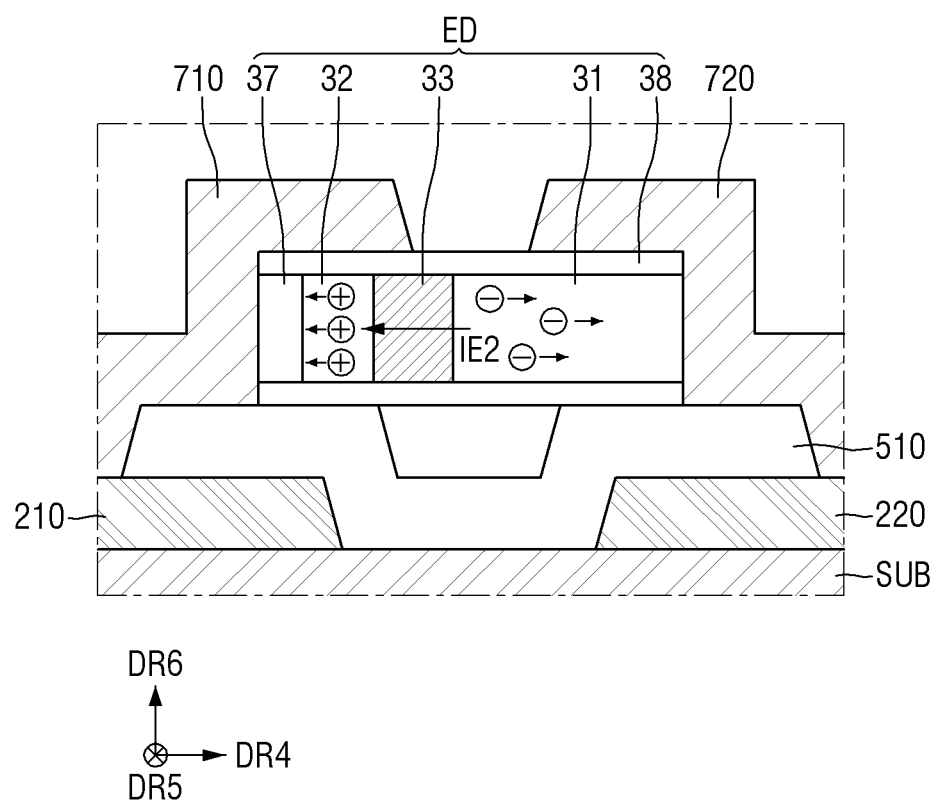

Referring to FIG. 13, when the first electrode 210 and the second electrode 220 receive a voltage (e.g., a set or predetermined voltage) to allow a desired current (e.g., a set or predetermined current) to flow and the high-energy inspection light L1 to be applied onto the light emitting element ED, electrons and holes are separated in the light emitting element ED by the inspection light L1, so that a photocurrent IE2 may flow in the light emitting element ED.

For example, as described above, the first semiconductor layer 31 doped with the first conductivity type dopant may be n-GaN doped with n-type Si, and the second semiconductor layer 32 doped with the second conductivity type dopant may be p-GaN doped with p-type Mg. When the light emitting element ED is irradiated with light in a short wavelength band of high energy, electrons and holes are separated from the interface between the first semiconductor layer 31 and the light emitting layer 33 by the light energy, so that the separated electrons may move toward the first semiconductor layer 31. Further, when the light emitting element ED is irradiated with light in a short wavelength band of high energy, electrons and holes are separated from the interface between the second semiconductor layer 32 and the light emitting layer 33 by the light energy, so that the separated holes may move toward the second semiconductor layer 32. Accordingly, because electrons move to the first semiconductor layer 31 and holes move to the second semiconductor layer 32 by the inspection light L1 having high energy, a photocurrent IE2 flowing from the first semiconductor layer 31 to the second semiconductor layer 32 may be generated in the light emitting element ED.

Subsequently, the second inspection current I2 measured by emitting the inspection light L1 from the light source member LS and using a current measuring device ES may be different from the first inspection current I1 by the photocurrent IE2 generated from the light emitting element ED.

Subsequently, whether the display device 10 has a contact failure is determined based on a difference between the first inspection current I1 and the second inspection current I2 (S400, FIG. 9).

In some embodiments, the difference between the first inspection current I1 and the second inspection current I2 may be changed depending on whether the contact between both ends of the light emitting element ED and the first and second contact electrode 710 and 720 is defective. For example, despite the generation of photocurrent IE2 in the light emitting element ED, when the contact between both ends of the light emitting element ED and at least one of the first contact electrode 710 and the second contact electrode 720 is defective, the difference between the first inspection current I1 and the second inspection current I2 may be small. Thus, a current does not easily flow because there is no contact between at least one of both ends of the light emitting element ED and the contact electrodes 710 and 720, or may not easily flow because the contact area between the light emitting element ED and the contact electrodes 710 and 720 is small and thus resistance increases. In contrast, when the contacts between both ends of the light emitting element ED and the first contact electrode 710 and the second contact electrode 720 are normal, the difference between the second inspection current I2 and the first inspection current I1 may be relatively large due to the photocurrent IE2 flowing in the light emitting element ED. Accordingly, whether the display device 10 has a contact failure may be determined by using the difference between the measured second inspection current I2 and the first inspection current I1.

Figure 14:
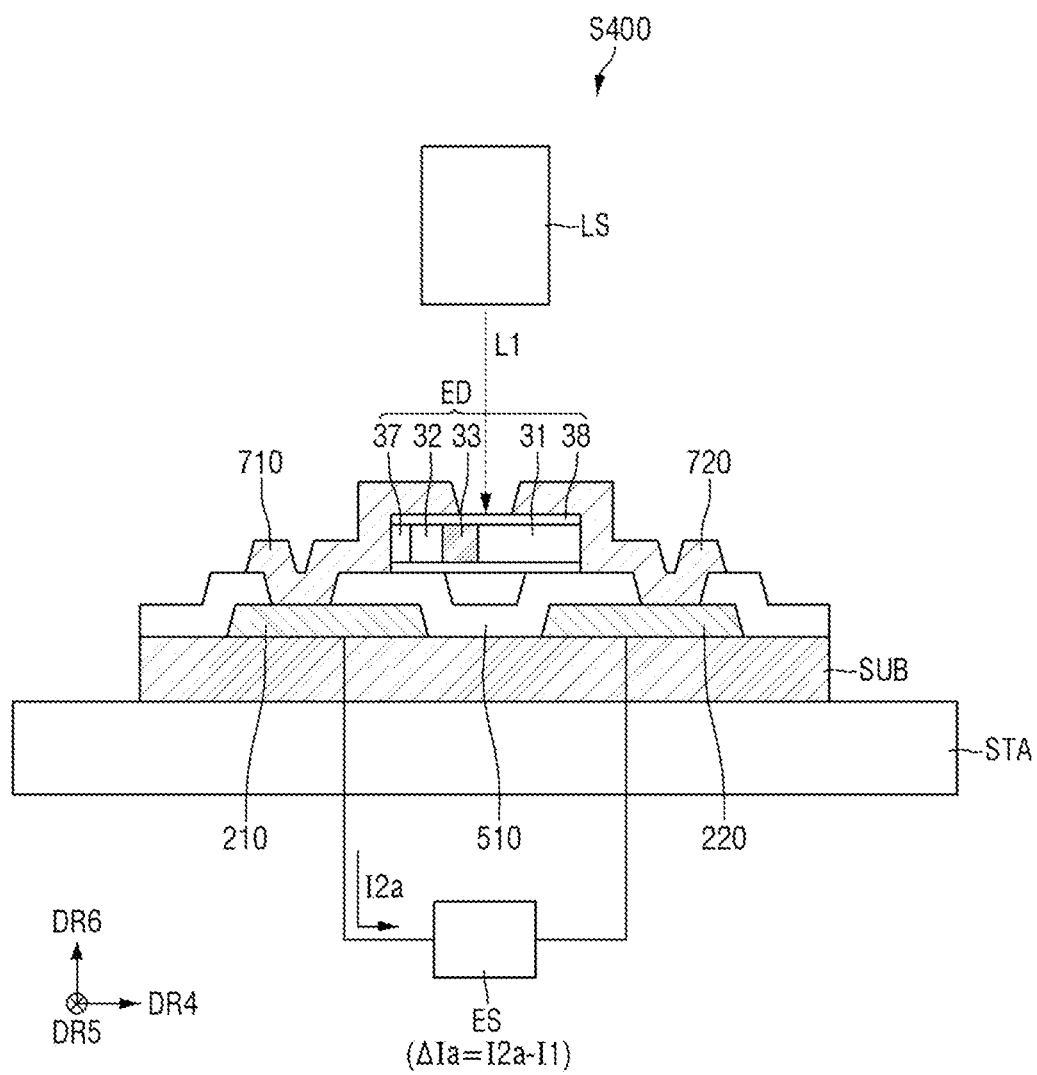
Figure 15:
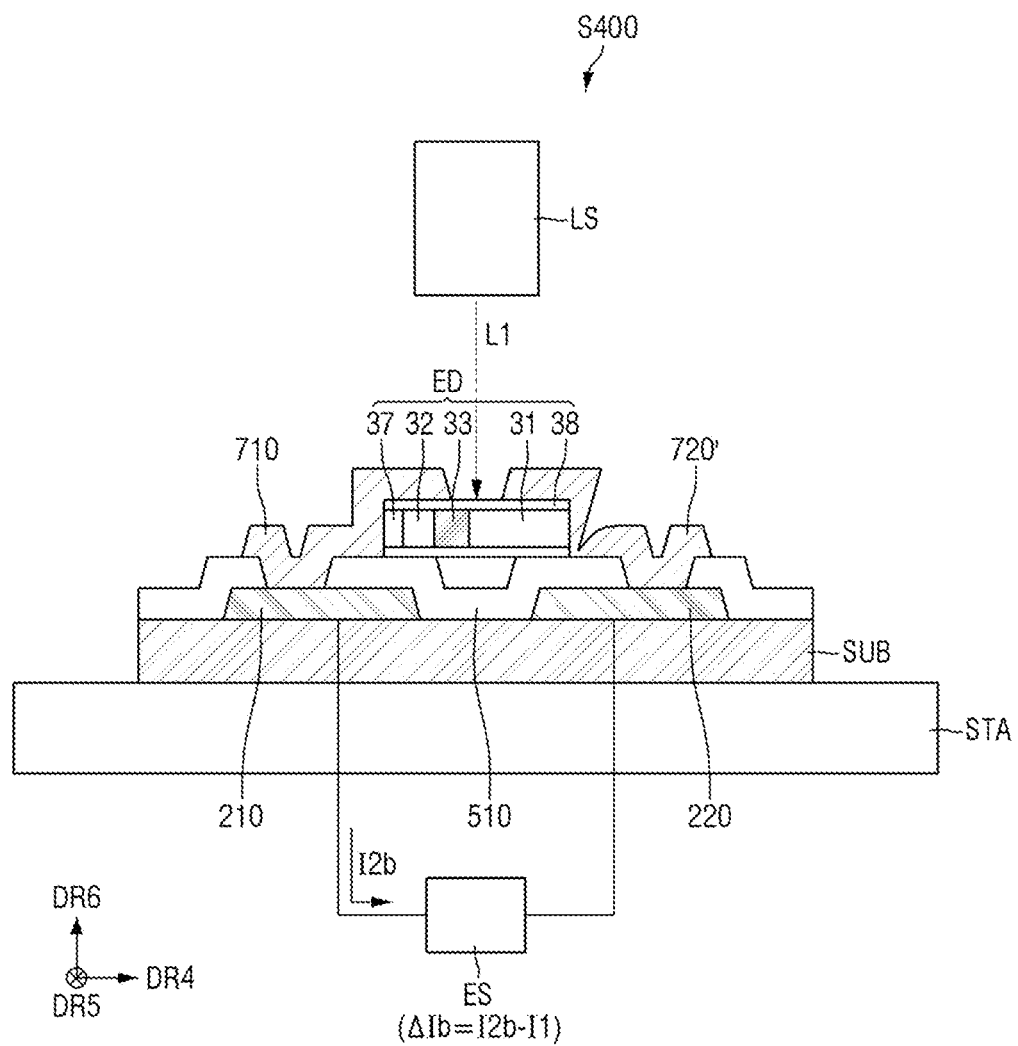

For example, referring to FIGS. 8, 14, and 15, the control unit CU may calculate the amount of current ΔIa or ΔIb changed by the irradiation of the inspection light L1 using the current measuring device ES, that is, the inspection current change ΔIa or ΔIb, which is the amount of change between each of the first inspection current I1 and the second inspection current I2a or I2b.

FIG. 14 is a cross-sectional view illustrating a case where the contact between both ends of the light emitting element ED and the first and second contact electrodes 710 and 720 is normal. When it is determined that calculated inspection current change ΔIa is greater than or equal to the reference current change by comparing calculated inspection current change ΔIa with the reference current change, the control unit CU may determine that the display device 10 is normal. That is, the control unit CU may determine that the contact between the light emitting element ED and the contact electrodes 710 and 720 is normal.

FIG. 15 is a cross-sectional view illustrating a case where the contact between both ends of the light emitting element ED and the first and second contact electrodes 710 and 720 is defective. When it is determined that calculated inspection current change ΔIb is smaller than the reference current change by comparing the inspection current change ΔIb with the reference current change, the control unit CU may determine that the display device 10 is defective. That is, the control unit CU may determine that the contact between the light emitting element ED and the contact electrodes 710 and 720 (or 720' as shown in FIG. 15) is defective.

Figure 16:
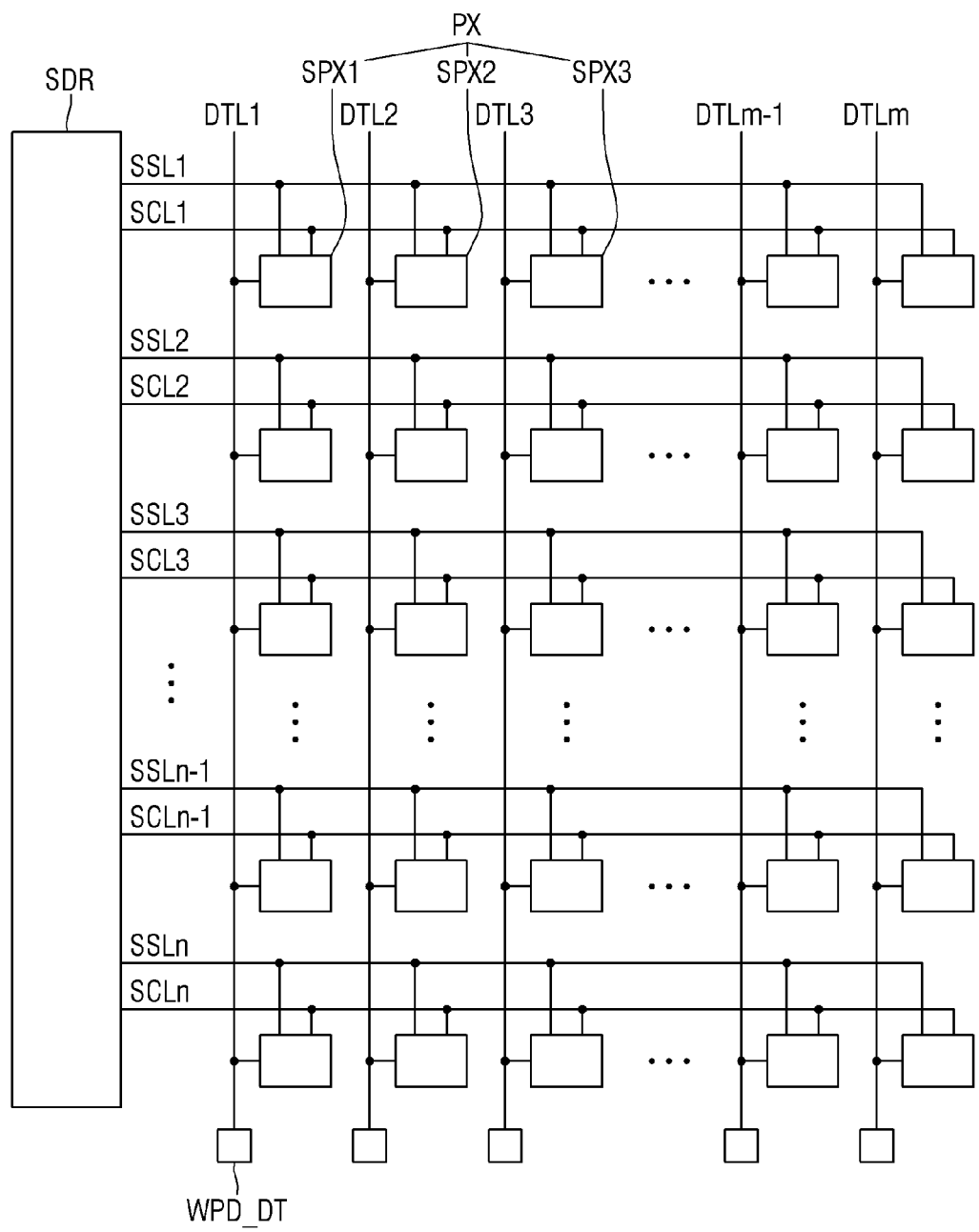
FIG. 16 is a layout view illustrating data lines, scan lines, and sensing lines of a display device, for explaining a method of manufacturing a display device.
Figure 17:
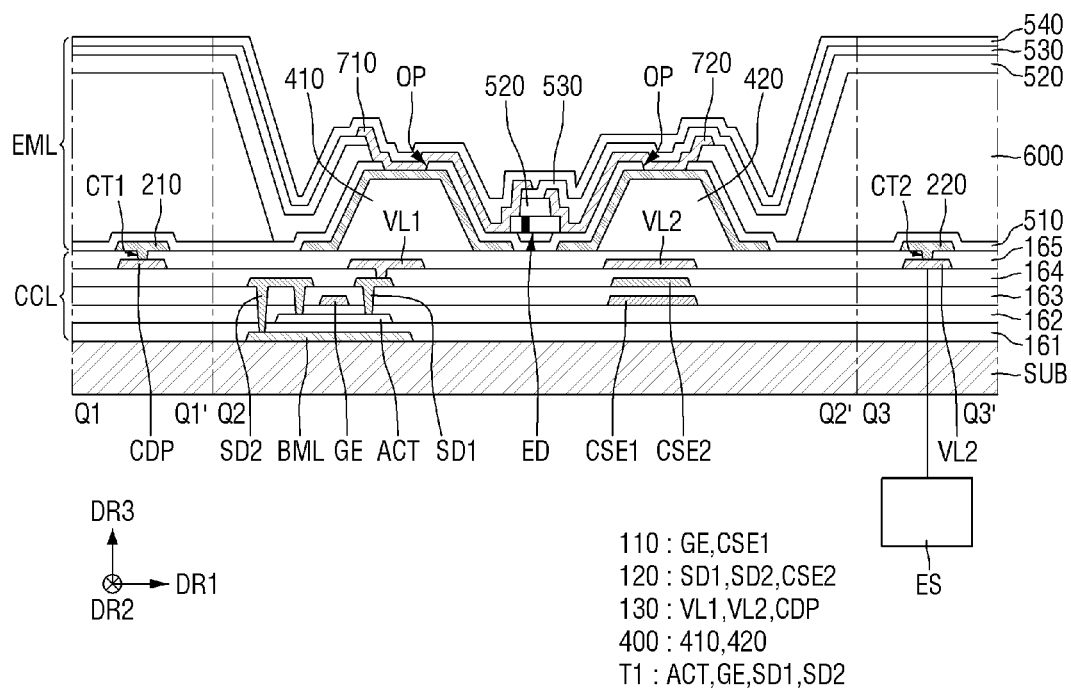
FIGS. 17 and 18 are cross-sectional views illustrating the steps in a process of manufacturing a display device.
Figure 18:
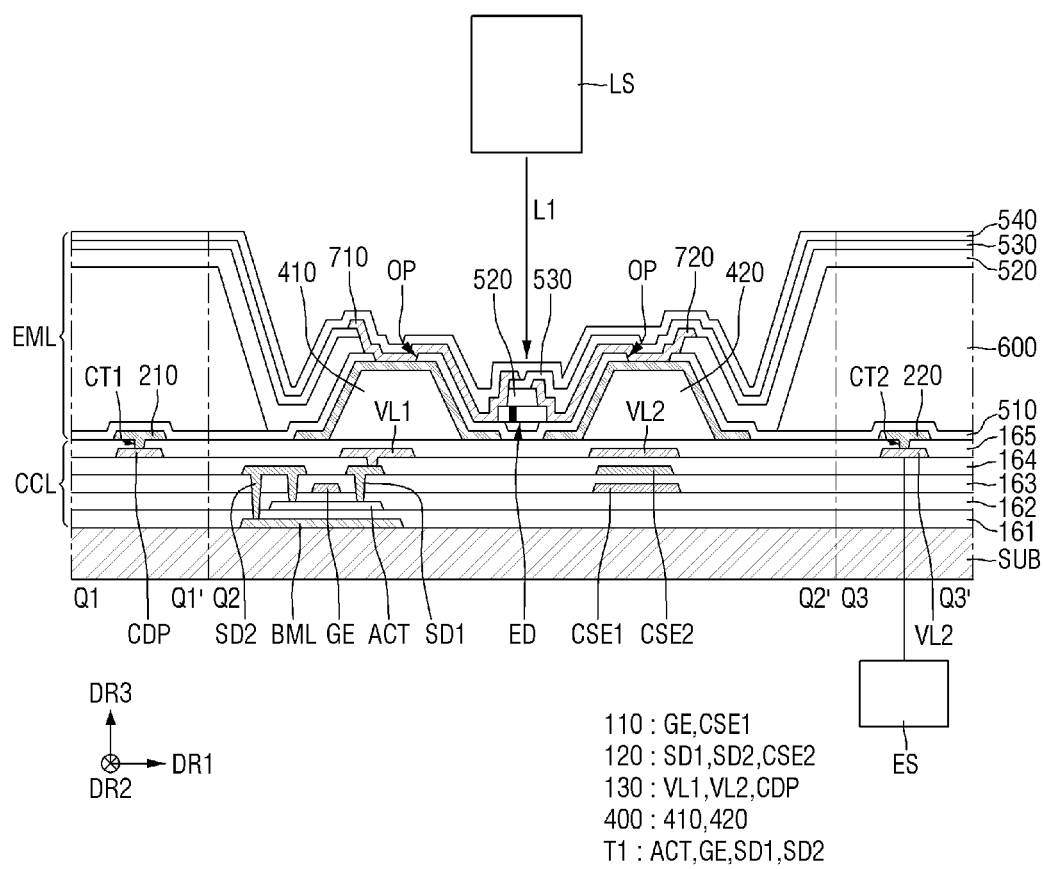

FIG. 16 is a layout view illustrating data lines, scan lines, and sensing lines of a display device, for explaining a contact inspection method for each sub-pixel. FIGS. 17 and 18 are cross-sectional views illustrating the steps in a process of manufacturing a display device.

First, referring to FIG. 5, a substrate SUB, a circuit layer CCL disposed on the substrate SUB and including a first transistor T1, a first voltage line VL1, and a second voltage line VL2, and a light emitting element layer EML disposed on the circuit layer CCL and including first and second electrodes 210 and 220, a light emitting element ED, first and second contact electrodes 710 and 720, and a plurality of insulating layers 510, 520, 530, and 540 are provided.

Subsequently, referring to FIGS. 3, 16 and 17, a first inspection voltage may be applied to the first voltage line VL1 of the circuit layer CCL, a second inspection voltage may be applied to the second voltage line VL2 of the circuit layer CCL, a scan signal may be applied to the first scan line SCL1 such that a desired current (e.g., a set or predetermined current) flows through each of the plurality of sub-pixels SPX arranged in the first row, and first to m-th data signals may be applied to first to m-th data lines DTL1 to DTLm arranged in first to m-th rows, respectively.

In this case, a desired current (e.g., a set or predetermined current) flows through the plurality of sub-pixels SPX located in the first row and arranged in the first to m-th columns, respectively, by the first inspection voltage and the second inspection voltage. Then, a first inspection current I1 (refer to FIG. 11) flowing through the second voltage line VL2 disposed in each column may be measured using the above-described current measuring device ES.

The method of applying the first inspection voltage to the first voltage line VL1, applying the second inspection voltage to the second voltage line VL2, applying the scan signal to the first scan line SCL1 disposed in the first row, and applying the first to m-th data signals to the first to m-th data lines DTL1 to DTLm, respectively, are not particularly limited. For example, the first inspection voltage, the second inspection voltage, the data signals, and the scan signal may be applied by applying electrical signals to the above-described first voltage pad WPD_VDD, second voltage pad WPD_VSS, data pad WPD_DT, and wiring pad WPD_CW, respectively (e.g., see FIG. 2).

Subsequently, referring to FIGS. 3, 16, and 18, while the first inspection voltage is applied to the first voltage line VL1 of the circuit layer CCL, the second inspection voltage is applied to the second voltage line VL2 of the circuit layer CCL, the scan signal is applied to the first scan line SCL1 such that a desired current (e.g., a set or predetermined current) flows through each of the plurality of sub-pixels SPX arranged in the first row, and the first to m-th data signals are applied to the first to m-th data lines DTL1 to DTLm arranged in the first to m-th rows, respectively, the inspection light L1 may be applied onto the display device 10 from the light source member LS disposed above the display device 10.

In this case, a desired current (e.g., a set or predetermined current) flows through the plurality of sub-pixels SPX located in the first row and arranged in the first to m-th columns, respectively, by the first inspection voltage, the second inspection voltage, and the inspection light L1. Then, the inspection light L1 may be applied onto the display device 10, and a second inspection current I2 (refer to FIG. 12) flowing through the second voltage line VL2 disposed in each column may be measured using the above-described current measuring device ES.

As described above, the photocurrent IE2 may flow in the light emitting element ED by the inspection light L1. Accordingly, during the irradiation of the inspection light L1, the second inspection current I2 (refer to FIG. 12) flowing through the second voltage line VL2 may be measured using the current measuring device ES. The second inspection current I2 flowing through the second voltage line VL2 may be measured for each of the sub-pixels SPX arranged in the first to m-th columns. Accordingly, among the plurality of sub-pixels SPX arranged in the first row, the row in which a contact failure occurred between the first and second contact electrodes 710 and 720 and the light emitting element ED may be detected using a difference between the second inspection current I2 and the first inspection current I1 of each of the plurality of sub-pixels SPX arranged in the first row and the first to m-th columns. Accordingly, among the plurality of sub-pixels SPX arranged in the first row, a defective sub-pixel SPX may be detected.

For example, when the difference between the second inspection current I2 and the first inspection current I1 measured in some of the plurality of sub-pixels SPX arranged in the first to m-th columns is smaller than the reference current change, it may be determined that a defect has occurred in the corresponding sub-pixel SPX. Further, when the difference between the second inspection current I2 and the first inspection current I1 measured in other ones of the plurality of sub-pixels SPX arranged in the first to m-th columns is greater than or equal to the reference current change, it may be determined that the corresponding sub-pixel SPX is normal.

Subsequently, when the inspection for a contact failure of the plurality of sub-pixels SPX arranged in the first row is completed, inspection for a contact failure of the plurality of sub-pixels SPX arranged in the second row may be performed. The inspection for a contact failure of the plurality of sub-pixels SPX arranged in the second row may be performed in the same manner as the inspection for a contact failure of the plurality of sub-pixels SPX arranged in the first row. The contact failure of each of the plurality of sub-pixels SPX arranged in the first to n-th rows may be inspected by repeating such inspections.

In some embodiments of the present disclosure, a method of inspecting a contact failure of each sub-pixel SPX by applying a scan signal to one scan line SCL disposed in the same row and applying data signals to the plurality of data lines DTL1 to DTLm arranged in the first to m-th columns, respectively, is discussed, but the present disclosure is not limited thereto. For example, a contact failure of each sub-pixel SPX may be inspected by applying a data signal to one data line DTL disposed in the same row and applying scan signals to the plurality of scan lines SCL1 to SCLn arranged in the first to n-th rows, respectively.

In the method of inspecting a display device according to the present disclosure, suitable voltages (e.g., set or predetermined voltages) may be applied to the first electrode 210 and the second electrode 220 of the display device 10 through the first voltage line VL1 and the second voltage line VL2, respectively, to measure a first inspection current I1, the inspection light L1 may be applied onto the display device 10 in a state in which suitable voltages (e.g., set or predetermined voltages) are applied to the first electrode 210 and the second electrode 220, respectively, to measure a second inspection current I2, and a contact failure between the light emitting element ED and the contact electrodes 710 and 720 may be determined based on a difference between the first inspection current I1 and the second inspection current I2. Further, the plurality of pixels PX or sub-pixels SPX arranged in the same row or column may be driven at once by using the transistors (for example, the first transistor T1 and the second transistor T2) included in the circuit layer CCL of the display device 10, thereby inspecting the plurality of pixels PX or sub-pixels SPX arranged in the same row or column at once. As described above, because a current is specified using the electrical characteristics of the display device 10 or the light emitting element ED, it is possible to determine whether there is a contact failure between the light emitting element ED and contact electrodes 710 and 720 included in the plurality of pixels PX or sub-pixels SPX arranged in the same row or column, so that inspection time may be shortened as compared with a method of inspecting a contact failure using optical characteristics, and thus the efficiency of an inspection process may be improved.

In the method of inspecting a display device according to an embodiment, whether or not a display device is defective may be determined based on electrical characteristics, thereby shortening inspection time. Further, a plurality of pixels or a plurality of sub-pixels arranged in the same row or column may be driven at once by using transistors included in a circuit layer of the display device, so that the plurality of pixels or the plurality of sub-pixels arranged in the same row or column may inspected at once, thereby shortening inspection time.

The aspects of the embodiments of the present disclosure are not limited by the foregoing, and other various aspects may be appreciated by those with ordinary skill in the art.

Although the embodiments of the present disclosure have been disclosed for illustrative purposes, those skilled in the art will appreciate that various modifications, additions, and substitutions are possible, without departing from the scope and spirit of the present disclosure as disclosed in the accompanying claims, and their equivalents.

In concluding the detailed description, those skilled in the art will appreciate that many variations and modifications can be made to the embodiments without substantially departing from the principles of the present disclosure. Therefore, the embodiments of the present disclosure are used in a generic and descriptive sense only and not for purposes of limitation.

What is claimed is:

1. A method of inspecting a display device comprising a substrate, a light emitting element on the substrate, a first contact electrode on one end of the light emitting element, and a second contact electrode spaced from the first contact electrode and on an other end of the light emitting element, the method comprising:
   applying a first inspection voltage and a second inspection voltage to the first contact electrode and the second contact electrode, respectively, and measuring a first inspection current; and
   while applying the first inspection voltage and the second inspection voltage to the first contact electrode and the second contact electrode, respectively, irradiating the light emitting element with inspection light and measuring a second inspection current, and
   determining a contact failure between the light emitting element and the first contact electrode or the second contact electrode based on the first inspection current and the second inspection current.

2. The method of claim 1, further comprising:
   calculating an inspection current change, the inspection current change being an amount of change between the first inspection current and the second inspection current,
   wherein the contact failure between the light emitting element and the first and second contact electrodes is based on the calculated inspection current change.

3. The method of claim 2, further comprising:
   determining that a contact between the light emitting element and the first and second contact electrodes is defective in case the inspection current change is smaller than a reference current change; and
   determining that the contact between the light emitting element and the first and second contact electrodes is normal in case the inspection current change is greater than or equal to the reference current change.

4. The method of claim 2, wherein the inspection current change is a value obtained by subtracting the first inspection current from the second inspection current.

5. The method of claim 1, wherein the inspection light comprises light of a short wavelength band having high energy.

6. The method of claim 5, wherein the inspection light comprises ultraviolet light.

7. The method of claim 1, wherein the light emitting element comprises a first semiconductor layer at the other end of the light emitting element, a second semiconductor layer at the one end of the light emitting element, and a light emitting layer between the first semiconductor layer and the second semiconductor layer.

8. The method of claim 7, wherein the first semiconductor layer comprises an n-type semiconductor layer, and the second semiconductor layer comprises a p-type semiconductor layer.

9. The method of claim 8, wherein, when the inspection light is irradiated, electrons move toward the first semiconductor layer in the light emitting element, and holes move toward the second semiconductor layer in the light emitting element, so that a photocurrent is generated in the light emitting element.

10. The method of claim 1, wherein the display device further comprises a first electrode and a second electrode on the substrate and spaced from each other, and
    wherein the one end of the light emitting element is on the first electrode, and the other end of the light emitting element is on the second electrode.

11. The method of claim 10, wherein the first contact electrode is on the first electrode to contact the first electrode, and the second contact electrode is on the second electrode to contact the second electrode.

12. The method of claim 11, wherein the first inspection voltage is applied to the first contact electrode through the first electrode, and the second inspection voltage is applied to the second contact electrode through the second electrode.

13. The method of claim 10, wherein the display device further includes a first transistor electrically connected to the first electrode, a first voltage line electrically connected to the first transistor, and a second voltage line electrically connected to the second electrode, and
    wherein the first inspection current and the second inspection current are measured as a current flowing through the second voltage line.

14. The method of claim 13, wherein the first inspection voltage is applied to the first contact electrode through the first voltage line, and the second inspection voltage is applied to the second contact electrode through the second voltage line.

15. A method of manufacturing a display device, the method comprising:
    forming a first contact electrode at one end of a light emitting element on a substrate, and a second contact electrode spaced from the first contact electrode and at an other end of the light emitting element;
    applying a first inspection voltage and a second inspection voltage to the first contact electrode and the second contact electrode, respectively, and measuring a first inspection current;
    while applying the first inspection voltage and the second inspection voltage to the first contact electrode and the second contact electrode, respectively, irradiating the light emitting element with inspection light having high energy and measuring a second inspection current;
    calculating an inspection current change, which is an amount of change between the first inspection current and the second inspection current; and
    determining a contact failure between the light emitting element and the first and second contact electrodes based on the inspection current change.

16. The method of claim 15, further comprising:
    determining that contact between the light emitting element and the first and second contact electrodes is defective in case the inspection current change is smaller than a reference current change; and
    determining that the contact between the light emitting element and the first and second contact electrodes is normal in case the inspection current change is greater than or equal to the reference current change.

17. The method of claim 15, wherein the light emitting element comprises a first semiconductor layer at the other end of the light emitting element, a second semiconductor layer at the one end of the light emitting element, and a light emitting layer between the first semiconductor layer and the second semiconductor layer, and
    wherein the first semiconductor layer comprises an n-type semiconductor layer, and the second semiconductor layer comprises a p-type semiconductor layer.

18. The method of claim 17,
    wherein, when the inspection light is irradiated, electrons move toward the first semiconductor layer in the light emitting element, and holes move toward the second semiconductor layer in the light emitting element, so that a photocurrent is generated in the light emitting element.

19. The method of claim 15, wherein the display device further comprises a first electrode and a second electrode on the substrate and apart from each other, and wherein the one end of the light emitting element is on the first electrode, and the other end of the light emitting element is on the second electrode.

20. The method of claim 19, wherein the display device further comprises a first transistor electrically connected to the first electrode, a first voltage line electrically connected to the first transistor, and a second voltage line electrically connected to the second electrode, and wherein the first inspection current and the second inspection current are measured as a current flowing through the second voltage line.

\* \* \* \* \*